US012392034B2

(12) United States Patent
Azpitarte et al.

(10) Patent No.: US 12,392,034 B2
(45) Date of Patent: Aug. 19, 2025

(54) METHOD FOR PRODUCING ORGANIC-INORGANIC HYBRID MATERIALS

(71) Applicant: CIC NANOGUNE—ASOCIACIÓN CENTRO DE INVESTIGACIÓN COOPERATIVA EN NANOCIENCIAS, Guipuzcoa (ES)

(72) Inventors: Itxasne Azpitarte, Guipuzcoa (ES); Mato Knez, Guipuzcoa (ES)

(73) Assignee: CIC nanoGUNE—Asociación Centro de Investigación Cooperativa en Nanociencias, Guipuzcoa (ES)

( * ) Notice: Subject to any disclaimer, the term of this patent is extended or adjusted under 35 U.S.C. 154(b) by 894 days.

(21) Appl. No.: 17/262,329

(22) PCT Filed: Jul. 24, 2019

(86) PCT No.: PCT/EP2019/069970
§ 371 (c)(1),
(2) Date: Jan. 22, 2021

(87) PCT Pub. No.: WO2020/020972
PCT Pub. Date: Jan. 30, 2020

(65) Prior Publication Data
US 2021/0292899 A1 Sep. 23, 2021

(30) Foreign Application Priority Data
Jul. 24, 2018 (EP) .................................. 18382552

(51) Int. Cl.
*C23C 16/455* (2006.01)
*C23C 16/52* (2006.01)
(Continued)

(52) U.S. Cl.
CPC .. *C23C 16/45529* (2013.01); *C23C 16/45534* (2013.01); *C23C 16/45553* (2013.01);
(Continued)

(58) Field of Classification Search
CPC .............. C23C 16/45529; C23C 16/34; C23C 16/45553; C23C 16/45555; C23C 16/45559
See application file for complete search history.

(56) References Cited

U.S. PATENT DOCUMENTS

| | | | |
|---|---|---|---|
| 2009/0137043 A1* | 5/2009 | Parsons ............. | C23C 16/45525 428/221 |
| 2014/0264196 A1* | 9/2014 | Werner ................ | C23C 16/442 977/774 |

(Continued)

FOREIGN PATENT DOCUMENTS

| WO | 2017099057 A1 | 6/2017 |
|---|---|---|
| WO | 2018115369 A1 | 6/2018 |

OTHER PUBLICATIONS

Muraguchi, Ryo, et al., "Preparation and Properties of Organic-Inorganic Hybrid Antireflection Films Made by a Low-Temperature Process Using Hollow Silica Nanoparticles". ACS Omega 2021, 6, 8570-8577.*

(Continued)

*Primary Examiner* — Bret P Chen
(74) *Attorney, Agent, or Firm* — Pilloff Passino & Cosenza LLP; Rachel K. Pilloff; Sean A. Passino

(57) ABSTRACT

The present invention refers to a method for the preparation of organic-inorganic hybrid materials which comprises the combination of ALD and MPI techniques, to an organic-inorganic hybrid material obtainable by said method, and to the uses of said organic-inorganic hybrid material.

19 Claims, 4 Drawing Sheets

Figure 1:
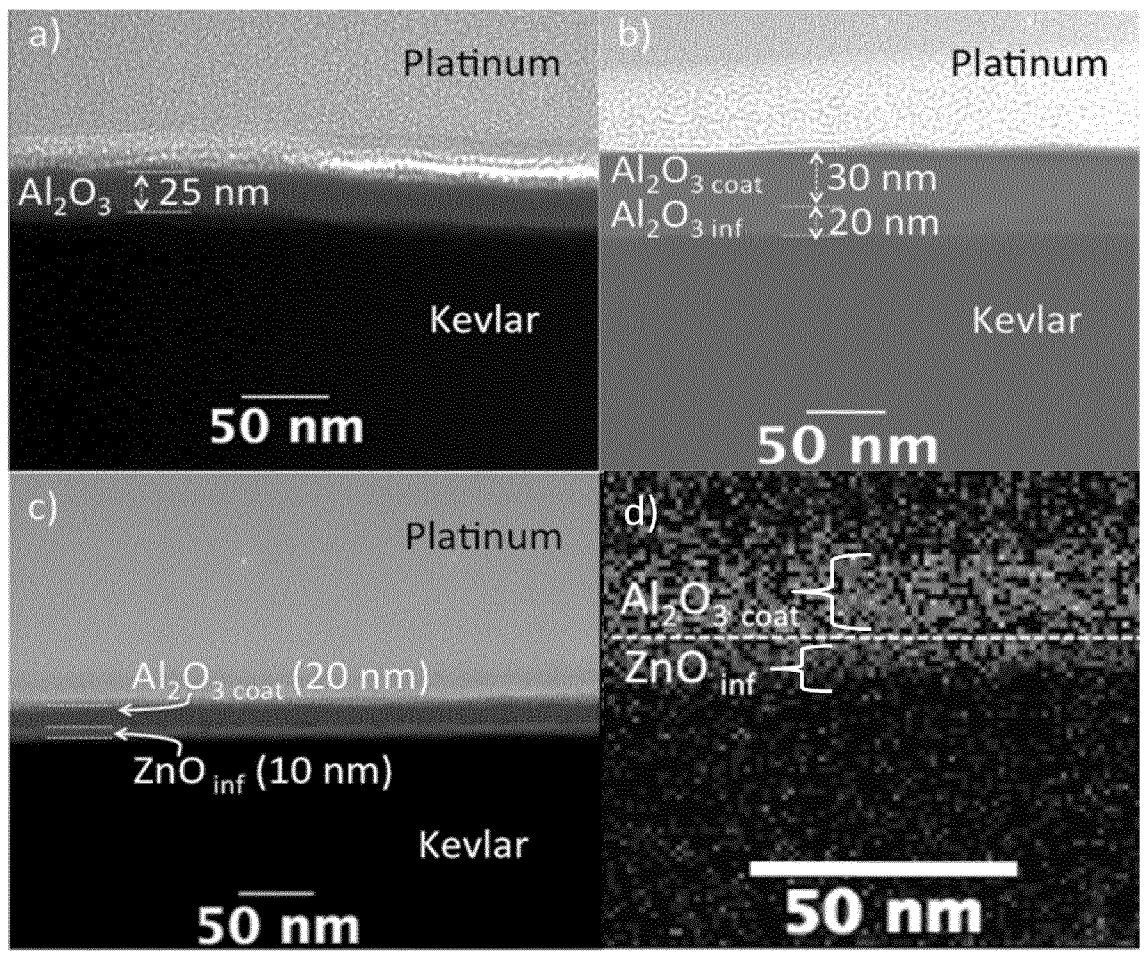

(51) Int. Cl.
    D06M 11/45      (2006.01)
    D06M 101/36     (2006.01)
(52) U.S. Cl.
    CPC .. *C23C 16/45555* (2013.01); *C23C 16/45559* (2013.01); *C23C 16/52* (2013.01); *D06M 11/45* (2013.01); *D06M 2101/36* (2013.01)

(56) References Cited

U.S. PATENT DOCUMENTS

| 2014/0287230 | A1* | 9/2014 | Walls | B01D 39/1615 |
| | | | | 428/338 |
| 2014/0346142 | A1 | 11/2014 | Chapuis et al. | |
| 2016/0293410 | A1* | 10/2016 | Lei | C23C 16/45536 |
| 2017/0166456 | A1* | 6/2017 | Darling | B01J 20/223 |
| 2018/0047920 | A1* | 2/2018 | Jang | B32B 27/08 |
| 2018/0127870 | A1* | 5/2018 | Losego | C08B 15/00 |
| 2018/0274101 | A1 | 9/2018 | Kano | |

OTHER PUBLICATIONS

Sanchez, Clement, et al., "Applications of advanced hybrid organic-inorganic nanomaterials: from laboratory to market". Chem. Soc. Rev., 2011, 40, 696-753.*

Draxl, Claudia, et al., "Organic/Inorganic Hybrid Materials: Challenges for ab Initio Methodology". Accounts of Chemical Research, 2014, 47, 3225-3232.*

Sanchez, Clement, et al., "Applications of hybrid organic-inorganic nanocomposites". Journal of Materials Chemistry, 2005, 15, 3559-3592.*

Chujo, Yoshiki, et al., "Organic-Inorganic Hybrid Materials". Current Opinion in Solid State and Materials Science, vol. 1, Issue 6, Dec. 1996, pp. 806-811.*

Christopher J. Oldham et al., "(Invited) Atomic Layer Deposition on Polymers: Applications to Physical Encapsulation of Electrospun Nylon Nanofibers," ECS Transactions, Jan. 1, 2010, pp. 279-290.

Itxasne Azpitarte et al., "Suppressing the Thermal and Ultraviolet Sensitivity of Kevlar by Infiltration and Hybridization with ZnO," Chemistry of Materials, Dec. 12, 2017, pp. 10,068-10,074, vol. 29, No. 23.

Gong Bo et al., "Hydrophilic mechanical buffer layers and stable hydrophilic finishes on polydimethylsiloxane using combined sequential vapor infiltration and atomic/molecular layer deposition," Journal of Vacuum Science and Technology, Part A, AVS /AIP, Melville, NY., US, Jan. 1, 2012, pp. 1A156-1A156, vol. 30, No. 1.

Sarah E. Atanasov et al., "Improved cut-resistance of Kevlar using controlled interface reactions during atomic layer deposition of ultrathin (<50 A) inorganic coatings," Journal of Materials Chemistry A, Aug. 29, 2014, pp. 17,371-17,379, vol. 2, No. 41.

Collen Z. Leng et al., "Vapor phase infiltration (VPI) for transforming polymers into organic-inorganic hybrid materials: a critical review of current progress and future challenges," Mater. Horiz., Jan. 1, 2017, pp. 747-771, vol. 4, No. 5.

Jae Jin Kim et al., "Mechanistic understanding of tungsten oxide in-plane nanostructure growth via sequential infiltration synthesis," Nanoscale, Jan. 1, 2018, pp. 3,469-3,479, vol. 10, No. 7.

International Search Report & Written Opinion for PCT/EP2019/069970, mailed Oct. 15, 2019.

* cited by examiner

METHOD FOR PRODUCING ORGANIC-INORGANIC HYBRID MATERIALS

FIELD OF THE INVENTION

The present invention relates to the area of vapor phase processing for producing organic-inorganic hybrid materials. More specifically, the present invention relates to a method for the preparation of organic-inorganic hybrid materials, to an organic-inorganic hybrid material obtainable by said method, to an organic-inorganic hybrid material and to the uses of said organic-inorganic material.

BACKGROUND

Hybrid organic-inorganic materials are used in various applications due to their unique properties. These materials not only combine the characteristic inorganic features of organic (flexibility, lightness, ease of processing, etc.) and inorganic (good thermal and chemical stability, conductivity, etc.) materials, but they often also outperform their individual properties or even introduce new ones. The most common strategies to synthetize hybrid materials are based on wet-chemical routes. However, these routes often result in physical mixtures with no synergistic interaction. Additionally, they offer a poor control of the hybridization level. Furthermore, the solvent molecules can seriously damage the properties of the resulting hybrid materials through shielding of reactions or simply creating cavities in the material that negatively affect the mechanical, electronic or optical properties. In contrast, solvent free vapor phase processes are good alternatives to synthetize high quality hybrid materials.

Atomic Layer deposition (ALD) is a vapor phase coating technology that creates thin films on top of substrates by sequentially supplying one or more precursors to a substrate surface to bind and sequentially react and, in this way, form a coating with great thickness control. J. W. Elam et al. [Spatially controlled atomic layer deposition in porous materials, Applied Physics Letters 91, 243105 (2007)] describes depositing materials within porous substrates to create "stripe coatings" based on ALD techniques using two types of precursors. During ALD technique precursors only react with the surface of the substrate and no infiltration or hybridization with the substrate is obtained. Consequently, the products obtained by ALD technique are limited to layered structures.

Recently developed vapor phase infiltration (VPI) technique, a modification of ALD, creates hybrid organic-inorganic materials by allowing the chemicals to not only attach to the surface of the substrate, but also to diffuse and react with the bulk of the polymer. VPI allows the introduction of inorganic materials into tightly packed and well-ordered polymers that, typically, do not allow inclusion of inorganic features. Methods based on VPI include multiple pulsed vapor-phase infiltration (VPI), sequential vapor infiltration (SVI) and sequential infiltration synthesis (SIS) and have been disclosed in several prior art documents. For instance, U.S. Patent Application No. US2018127870 (A1) describes a method for diffusing precursors into polymer substrates wherein polymers are exposed to a gas precursor in a static atmosphere environment created in a reaction chamber for extended periods of time instead of requiring sequential deposition processing. However, in addition to the infiltration, this technique also generates a coating layer of the infiltration material on the surface of the substrate.

The use of infiltration techniques followed by ALD has been also disclosed. For example, U.S. Patent Application No. US2014346142 (A1) describes a method for preparing inorganic features with patterned nanostructures comprising a sequential infiltration synthesis (SIS) of an inorganic material (alumina, titanium dioxide or ZnO) in a polymeric substrate and, optionally, a consecutive ALD process to grow an inorganic coating on the surface. Gong et al. [Hydrophilic mechanical buffer layers and stable hydrophilic finishes, J. Va. Sic. Technol. A 30(1), January/February 202] describes a method to create hydrophilic stable polymeric materials by infiltrating and then coating a polymeric substrate: firstly, the substrate is first infiltrated by exposing it during hours to a metalorganic precursor followed by a purge and exposure to water for several minutes; and then, several ALD cycles are performed to coat the infiltrated substrate. Nevertheless, processing times are long and the combination of different materials is not well controlled in this technique. Additionally, during the infiltration step the first precursor reacts unspecifically with the functional groups available both at the surface and in the bulk of the substrate and, thus, a coating layer is always generated on the surface of the substrate which in some applications is undesirable and sometimes diminishes the effect of the infiltration.

Among technical polymers, Kevlar® (poly paraphenylene terephthalamide) enjoys great reputation as high-strength polymer and material-of-choice for mechanically demanding applications, such as personal safety, sport equipment and aircrafts. The outstanding mechanical properties of Kevlar arise from its highly ordered crystalline structure, which evolves during extrusion of the polymeric fibers. In most of its applications, Kevlar is exposed to UV radiation, moisture and/or high temperatures. These environmental factors can disturb its ordered structure causing a huge impact in the mechanical performance of the polymer, thus compromising its reliability.

Since its discovery in 1965 tremendous work has been done aiming at improving Kevlar's stability against UV radiation and high temperatures. Though embedding Kevlar fibers in a resin was found to prevent the UV radiation from reaching the Kevlar fibers, and thus to avoid its degradation, the resulting composite material consisted of a heavy and rigid material with a still quite poor thermal stability. Following investigations showed that coating Kevlar fibers with a metal oxide positively impacts its mechanical properties and stability maintaining its lightness. However, due to the brittle nature of the inorganic coating, it can be detached from the fiber upon mechanical treatment. Atomic Layer Deposition (ALD) has been shown effective in the deposition of metal oxide on polymeric fibers for the mechanical properties improvement. The inorganic films deposited by ALD are chemically bound to the surface of the polymer, thus its adhesion is high even upon stretching. However, a quite thick metal oxide film has to be deposited on top of Kevlar for the UV protection of the fibers, which compromises its flexibility. Finally, Azpitarte et al. [Suppressing the Thermal and Ultraviolet Sensitivity of Kevlar by Infiltration and Hybridization with ZnO, Chem. Mater. 2017, 29, 10068-10074] found that the thermal and UV sensitivity of Kevlar can be suppressed by infiltration of ZnO through multiple pulsed infiltration (MPI). However, this method lessens the mechanical properties of the fibers. In particular, the toughness modulus of the fibers is reduced with respect to the original Kevlar fiber.

In summary, prior art methods for the preparation of organic-inorganic hybrid materials do not allow to selectively infiltrate and coat a substrate with a different material in such a way that coating of the substrate with the infiltration material does not occur. Therefore, there is still a need for a selective method. Additionally, there is also a need for new versatile processes that produce organic-inorganic hybrid materials with enhanced stability, mechanical properties and durability.

BRIEF DESCRIPTION OF THE INVENTION

The inventors of the present invention have found a method that allows to selectively infiltrate a substrate while avoiding the undesired characteristic coating of the inflating material on the surface of the substrate that is created during infiltration. On the contrary, the method of the invention allows preparing an organic-inorganic hybrid material that is infiltrated with a first material and coated with a second material, so that the first (infiltrating) material is not coating the surface of the substrate and so the second (coating) material directly interacts with the surface of the substrate.

This method consists on the combination of ALD and MPI techniques. For example, if a metallic, semimetallic or semiconductor coating is desired, the process consists of an ALD type of pulse of a metal, semimetal or semiconductor containing precursor, followed by an MPI type of pulse of a second metal, semimetal or semiconductor containing precursor and a final MPI type of pulse of one or more counter precursor(s) that react with the two immobilized metal, semimetal or semiconductor containing precursors. In this way, the first precursor, which was pulsed in the ALD type of sub-cycle, only reacts with the surface functional groups of the substrate and saturate them. This saturation prevents binding of the second metal, semimetal or semiconductor containing precursor during the subsequent MPI type of pulse. Consequently, in this stage the second precursor does to bind to the surface but penetrates the surface and binds to the further available functional groups in the subsurface area, thus infiltrating the substrate. Finally, the pulsed counter precursor(s) react with both metal, semimetal or semiconductor containing precursors creating a coating with one material on the surface and infiltrated metal compounds of another material.

Alternatively, two different counter precursors or co-reactants can be used. In this case, a first co-reactant that is selective for one of the first and second metal, semimetal or semiconductor containing precursor is first pulsed. Then, a second co-reactant is pulsed, which will react with the other unreacted metal, semimetal or semiconductor containing precursor. In this way, an infiltration layer and a coating layer of different nature can be formed.

The combination of ALD/MPI according to the present invention can be also used with organic molecule or organic molecule containing coatings. For example, when a substrate is exposed to one or more ALD type sub-cycles of an organic molecule that reacts with the surface functional groups of the substrate, or of a metal, semimetal or semiconductor containing precursor and an organic molecule, then the surface is saturated with a non-reactive layer and so the precursor used in the following MPI sub-cycle(s) does not bind to the surface of the substrate but infiltrates and reacts with the functional groups of the substrate below the surface.

This new method represents a breakthrough in the controlled synthesis of hybrid organic-inorganic materials, giving the opportunity to decide which material will coat the substrate while another material of choice will be infiltrated, thus allowing ample modification possibilities of the substrate's properties. This approach is of great importance for a large variety of applications of hybrid materials in various technological fields, since it solves the current limitations of this way of creating hybrid materials.

The methods of the invention make it possible to extend the tunability range of the properties of the resulting organic-inorganic hybrid material thanks to the variable choice of different materials for the coating and the infiltration. Thus, materials with precisely tunable properties can be obtained. In particular, organic-inorganic hybrid materials with improved durability and mechanical properties have been obtained by following the method of the invention.

Thus, in a first aspect, the invention is directed to a process for the preparation of organic-inorganic hybrid materials comprising the steps of:
 i) providing a polymeric substrate in a reaction chamber,
 ii) pulsing a first metal, semimetal or semiconductor precursor or a monofunctional or oligofunctional organic molecule into the reaction chamber and then purging the reaction chamber wherein there is no exposure time between the pulsing and the purging;
 iii) pulsing a second metal, semimetal or semiconductor precursor into the reaction chamber, followed by an exposure time and then purging of the reaction chamber, wherein the exposure time between the pulsing and the purging is at least 5 seconds; and
 iv) pulsing a co-reactant into the reaction chamber optionally followed by an exposure time and then purging of the reaction chamber, wherein the co-reactant reacts either with the first metal, semimetal or semiconductor precursor when no monofunctional or oligofunctional organic molecule is pulsed in step (ii) and/or with the second metal, semimetal or semiconductor precursor; and
 v) if necessary, pulsing a co-reactant into the reaction chamber optionally followed by an exposure time and then purging of the reaction chamber, wherein the co-reactant reacts with the unreacted first or second metal, semimetal or semiconductor precursor;
 wherein the co-reactant of step (iv) is different from the co-reactant of step (v); and
 wherein the first metal, semimetal or semiconductor precursor is different from the second metal, semimetal or semiconductor precursor.

In a second aspect the invention is directed to an organic-inorganic hybrid material obtainable by the process of the present invention.

In a third aspect, the present invention is directed to an organic-inorganic hybrid material comprising:
 a polymeric substrate,
 a coating layer on the surface of the polymeric substrate, wherein said coating layer comprises a first metal, semimetal or semiconductor compound or element or a monofunctional or oligofunctional organic molecule or a mixture thereof, and
 an infiltration layer within the polymeric substrate, wherein said infiltration layer comprises a second metal, semimetal or semiconductor compound or element, wherein the first and the second metal, semimetal or semiconductor compound or element are different and wherein said coating layer does not comprise said second metal, semimetal or semiconductor compound or element.

In a further aspect, the present invention is directed to the use of the organic-inorganic hybrid materials of the present invention in the fabrication of flexible and light polymeric transistors, capacitors, optoelectronic devices, barriers, absorbers, personal safety equipment such as ballistic vest and military equipment, sport equipment, protective laminate, building materials, textiles, automotive or aircraft materials.

FIGURES

FIG. 1: TEM images of FIB-prepared cross-sections of a) alumina-coated Kevlar (C—$Al_2O_3$), b) alumina-infiltrated Kevlar (1-$Al_2O_3$), c) Kevlar coated with alumina and infiltrated with ZnO (TMA pulse) and d) EDS color map of the TMA pulse sample.

Figure 2:
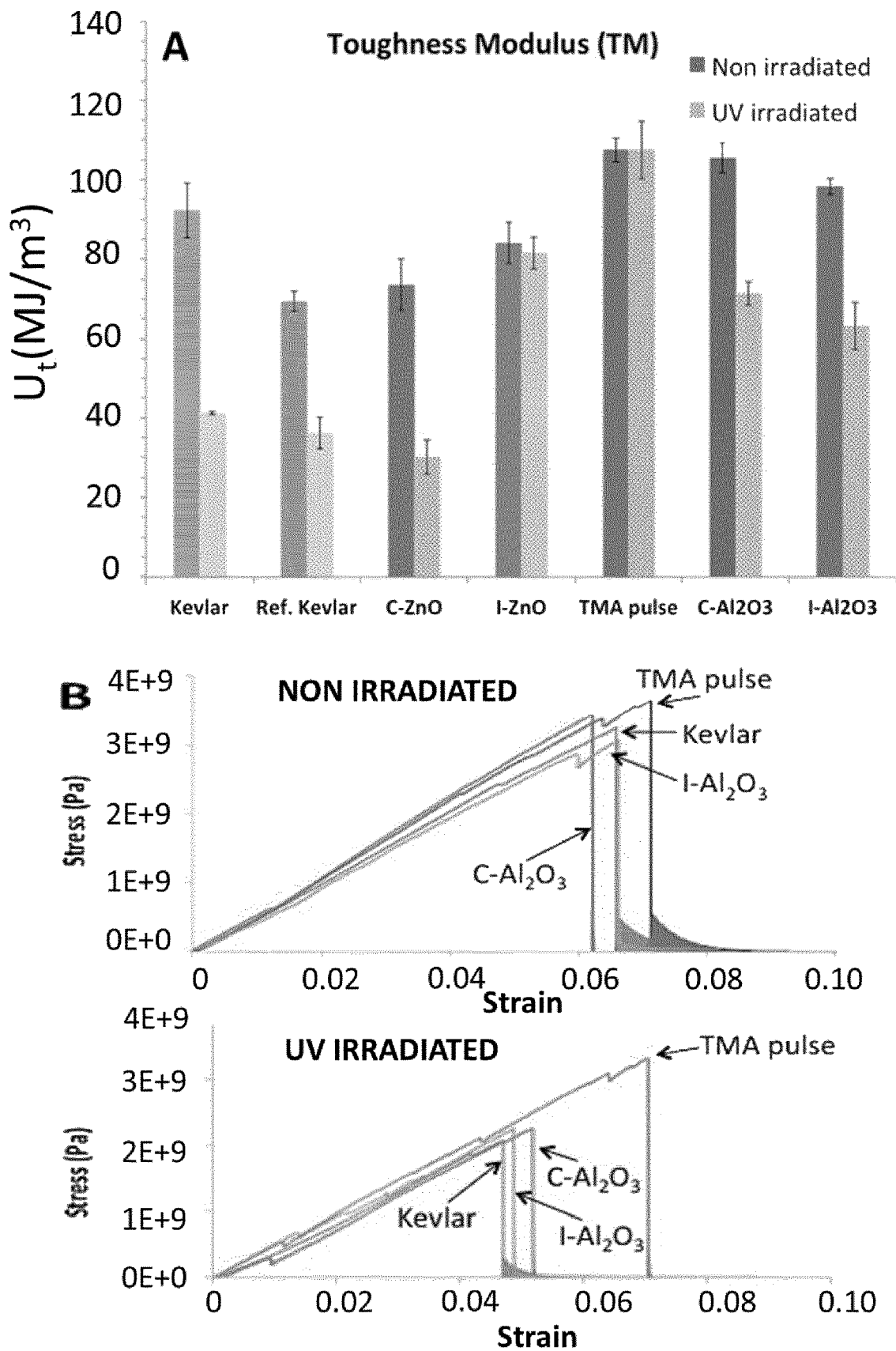

FIG. 2: Mechanical properties [a) toughness, b) stress] of untreated Kevlar fibers and fibers after infiltration (1-$Al_2O_3$) or coating (C—$Al_2O_3$) with $Al_2O_3$ and after infiltration with ZnO and coating with $Al_2O_3$(TMA pulse).

Figure 3:
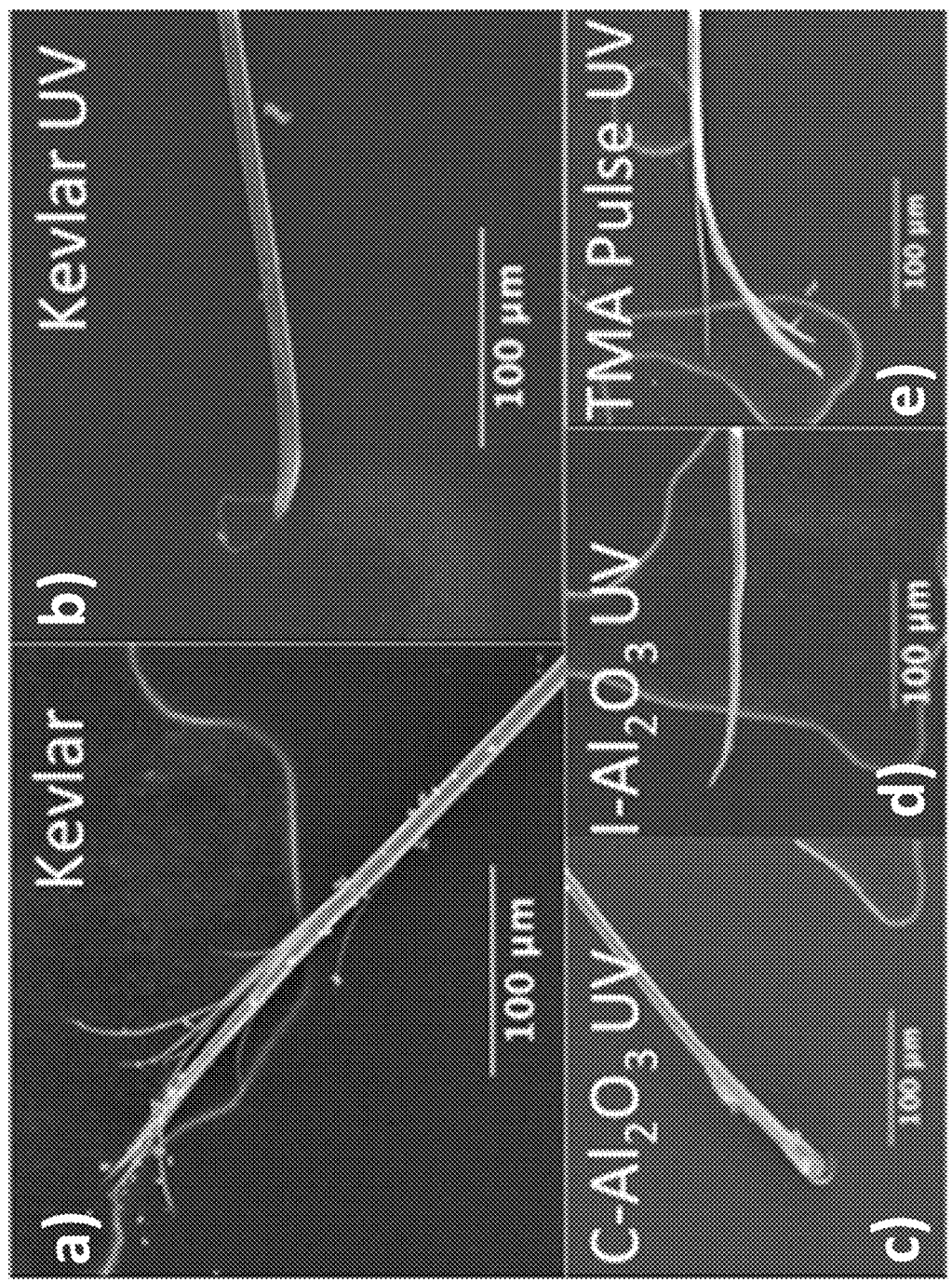

FIG. 3: SEM images of the broken ends of a) Kevlar fibers before irradiation and b) original, c) coated, d) infiltrated and e) coated and infiltrated Kevlar fibers after irradiation with UV light.

Figure 4:
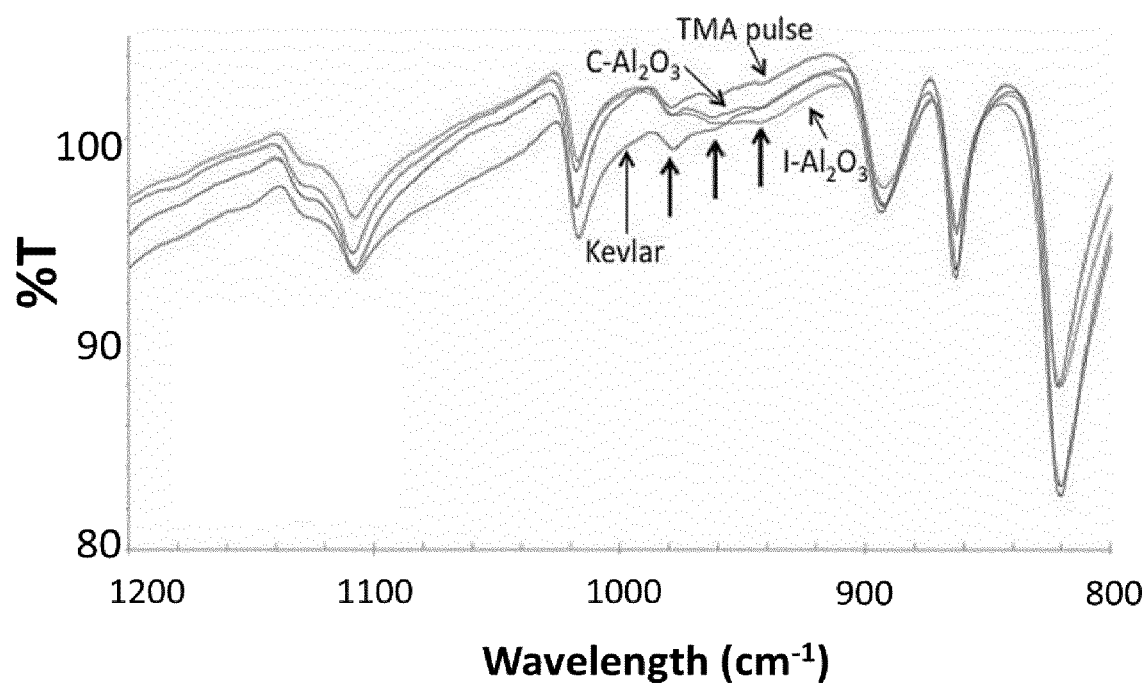

FIG. 4: ATR-FTIR spectra of the fingerprint area (1200-800 $cm^{-1}$) of Kevlar fibers before and after coating, infiltration and coating+infiltration.

DETAILED DESCRIPTION OF THE INVENTION

Unless defined otherwise, all technical and scientific terms used herein have the same meaning as commonly understood to one of ordinary skill in the art to which this disclosure belongs. As used herein, the singular forms "a" "an" and "the" include plural reference unless the context clearly dictates otherwise.

Process for the Preparation of Organic-Inorganic Hybrid Materials

The invention is directed to a process for the preparation of organic-inorganic hybrid materials as defined above in the first aspect.

The term "if necessary" in step v) means that this step is included in the process if the co-reactant used in step iv) reacts with only one of the first and the second precursors, i.e. if it is selective for one of them (and so does not react with the other one). In that case, a different co-reactant is pulsed in step v) to react with the unreacted first or second precursor.

The "unreacted" first or second precursor refers to the precursor that does not react with the co-reactant of step iv), i.e. the precursor for which the co-reactant of step iv) is not selective. In other words, if the co-reactant of step iv) is selective for (and so reacts with) the first precursor, then the unreacted precursor is the second metal, semimetal or semiconductor precursor. When the co-reactant of step iv) is selective for (and so reacts with) the second precursor, then the unreacted precursor is the first metal, semimetal or semiconductor precursor. The co-reactant of step v) does not need to be selective for the unreactive precursor since the other metal, semimetal or semiconductor precursor will be no longer available for reaction with said co-reactant.

Step (iv) or step (v) of the process can independently have an exposure time after pulsing a co-reactant into the reaction chamber.

When the co-reactant in step iv) reacts only with the second precursor, said step preferably includes an exposure time of at least 5 seconds, so that the co-reactant can react with the infiltrated second precursor. When the co-reactant in step iv) reacts only with the first precursor, an exposure time is not needed. Nevertheless, in a particular embodiment, said step may include an exposure time, preferably an exposure time of at least 1 second, or at least 2 seconds, or at least 3 second, or at least 4 seconds, or preferably at least 5 seconds.

Similarly, when the co-reactant in step v) reacts with the second precursor, said step preferably includes an exposure time of at least 5 seconds, so that the co-reactant can react with the infiltrated second precursor. When the co-reactant in step v) reacts only with the first precursor an exposure time is not needed. Nevertheless, in a particular embodiment, said step includes an exposure time, preferably an exposure time of at least 1 second, or at least 2 seconds, or at least 3 second, or at least 4 seconds, or preferably at least 5 seconds.

In a particular embodiment, step iv) comprises pulsing a first co-reactant into the reaction chamber followed by an exposure time and then purging of the reaction chamber, wherein the exposure time between the pulsing and the purging is at least 5 second and wherein the first co-reactant reacts only with the second metal, semimetal or semiconductor precursor; and step v) comprises pulsing a second co-reactant into the reaction chamber optionally followed by an exposure time and then purging of the reaction chamber, wherein the second co-reactant reacts with the first metal, semimetal or semiconductor precursor; to obtain a coated and infiltrated polymeric substrate.

In another embodiment, step iv) comprises pulsing a first co-reactant into the reaction chamber optionally followed by an exposure time and then purging of the reaction chamber, wherein the first co-reactant reacts only with the first metal, semimetal or semiconductor precursor; and step v) comprises pulsing a second co-reactant into the reaction chamber followed by an exposure time and then purging of the reaction chamber, wherein the exposure time between the pulsing and the purging is at least 5 second and wherein the second co-reactant reacts with the second metal, semimetal or semiconductor precursor; to obtain a coated and infiltrated polymeric substrate.

Precursors having selectivity for one co-reactant compared to others are known in the art. Therefore, the skilled person in the art knows how to select the suitable first and second precursors and the co-reactants that selectively react with only said first or said precursor. For instance, it is known that DEZ (zinc precursor) can react with sulfides (for example $H_2S$) to form ZnS, while TMA (aluminium precursor) will not. Therefore, a process with TMA-DEZ-$H_2S$—$H_2O$ would result in infiltrated ZnS and coated $Al_2O_3$.

Preferably, the co-reactant in step iv) reacts with both the first and the second metal, semimetal or semiconductor precursors, i.e. it is not selective for one of them, and therefore step v) is not performed. In that case, there is an exposure time of at least 5 seconds between the pulsing and the purging, so that the co-reactant reacts with the first and second precursors. In this case, since the same co-reactant is used for the two precursors, the coating layer and the infiltration layer will be of the same nature. Therefore, in an embodiment, the process of the invention comprises the steps of:
  i) providing a polymeric substrate in a reaction chamber;
  ii) pulsing a first metal, semimetal or semiconductor precursor or a monofunctional or oligofunctional organic molecule into the reaction chamber and then purging the reaction chamber wherein there is no exposure time between the pulsing and the purging;
  iii) pulsing a second metal, semimetal or semiconductor precursor into the reaction chamber, followed by an exposure time and then purging of the reaction chamber, wherein the exposure time between the pulsing and the purging is at least 5 seconds; and iv) pulsing a co-reactant into the reaction chamber followed by an exposure time and then purging of the reaction chamber, wherein the exposure time between the pulsing and the purging is at least 5 seconds and wherein the co-reactant reacts with the first metal, semimetal or semiconductor precursor (when no monofunctional or oligofunctional organic molecules is pulsed) and with the second metal, semimetal or semiconductor precursor to obtain a coated and infiltrated polymeric substrate;

wherein the first metal, semimetal or semiconductor precursor is different from the second metal, semimetal or semiconductor precursor.

Each step of the process can be independently repeated a desired number of times, for example until the desired thickness (of coating and infiltration) is achieved. In particular at least 10 times; more particularly at least 100 times.

As described above, step ii) saturates the surface of the polymeric substrate so that the second metal, semimetal or semiconductor precursor of step iii) does not react with the surface of the polymeric substrate, but penetrates into said substrate. Therefore, in an embodiment, step ii) is performed until the functional groups of the surface of the polymeric substrate are saturated, that is, until they are not free for reaction with the second metal, semimetal or semiconductor precursor of step iii).

Thus, in a particular embodiment, the surface of the coated polymer substrate obtained after step ii), and after step iv), is completely coated, preferably completely and homogeneously coated.

The metal, semimetal or semiconductor precursor may be understood to be a precursor that comprises a metal, semimetal or semiconductor element. In an embodiment, it is a metal precursor.

The monofunctional or oligofunctional organic molecule is preferably a monofunctional organic molecule. In an embodiment, the metal, semimetal or semiconductor precursor is a metal precursor and the monofunctional or oligofunctional organic molecule is a monofunctional organic molecule.

In a particular embodiment, step ii) comprises pulsing with a first metal, semimetal or semiconductor precursor. Therefore, in an embodiment, the process of the invention comprises:

i) providing a polymeric substrate in a reaction chamber,
ii) pulsing a first metal, semimetal or semiconductor precursor into the reaction chamber and then purging the reaction chamber wherein there is no exposure time between the pulsing and the purging, so that a polymeric substrate coated with the first metal, semimetal or semiconductor precursor is obtained,
iii) pulsing a second metal, semimetal or semiconductor precursor into the reaction chamber, followed by an exposure time and then purging of the reaction chamber, wherein the exposure time between the pulsing and the purging is at least 5 seconds, so that a polymeric substrate coated with the first metal, semimetal or semiconductor precursor and infiltrated with the second metal, semimetal or semiconductor precursor is obtained, and
iv) pulsing a co-reactant into the reaction chamber optionally followed by an exposure time and then purging of the reaction chamber, wherein the co-reactant reacts with the first and/or with the second metal, semimetal or semiconductor precursor; and
v) if necessary, pulsing a co-reactant into the reaction chamber optionally followed by an exposure time and then purging of the reaction chamber, wherein the co-reactant reacts with the unreacted first or second metal, semimetal or semiconductor precursor, so that a polymeric substrate coated with the first metal, semimetal or semiconductor compound or element and infiltrated with the second metal, semimetal or semiconductor compound or element is obtained.

Preferably, the co-reactant in step (iv) reacts with the first and with the second precursors and so step v) is not necessary.

In a particular embodiment, steps ii) to iv) are each repeated between 1 and 1.000 times; preferably between 50 and 1.000 times. In an embodiment the cycle of steps ii) to iii) or ii) to iv) are repeated between 1 and 1.000 times; preferably between 50 and 1.000 times.

In a preferred embodiment, steps ii) to iv) are carried out sequentially and the cycle of steps ii) to iv) is repeated between 1 and 1.000 times, preferably between 10 and 1.000 times, more preferably between 50 and 1.000 times, even more preferably between 50 and 500 times.

In the context of the present invention the term "cycle" comprises a series of steps of those of the process of the present invention such as for example steps (ii) to (iv).

In an embodiment of this process, a monofunctional or oligofunctional organic molecule is pulsed on the polymeric substrate coated with the first metal, semimetal or semiconductor precursor. In this case, one or more of the functional groups of the monofunctional or oligofunctional organic molecule reacts with the first metal, semimetal or semiconductor precursor giving rise to a non-reactive organic layer that prevents the second metal, semimetal or semiconductor precursor from binding to the surface of the polymeric substrate. Preferably, the monofunctional or oligofunctional organic molecule is a co-reactant of the first metal, semimetal or semiconductor precursor. That is, it reacts with the first metal, semimetal or semiconductor precursor to give rise to a first metal, semimetal or semiconductor compound or element. In this case, when the monofunctional or oligofunctional organic molecule is pulsed on the polymeric substrate coated with the first metal, semimetal or semiconductor precursor, a polymeric substrate coated with a first metal, semimetal or semiconductor compound or element (coated on the surface of the polymeric substrate) and a monofunctional or oligofunctional organic molecule (coated on the first metal, semimetal or semiconductor compound or element) is obtained.

Therefore, in a particular embodiment, the process comprises:

i) providing a polymeric substrate in a reaction chamber,
ii) pulsing a first metal, semimetal or semiconductor precursor into the reaction chamber and then purging the reaction chamber wherein there is no exposure time between the pulsing and the purging, to obtain a polymeric substrate coated with the first metal, semimetal or semiconductor precursor,
ii') pulsing a monofunctional or oligofunctional organic molecule into the reaction chamber and then purging the reaction chamber wherein there is no exposure time between the pulsing and the purging, wherein the monofunctional or oligofunctional organic molecule reacts with the first metal, semimetal or semiconductor precursor, to obtain a polymeric substrate coated with the first metal, semimetal or semiconductor compound or element and the monofunctional or oligofunctional organic molecule, iii) pulsing a second metal, semimetal or semiconductor precursor into the reaction chamber, followed by an exposure time and then purging of the reaction chamber, wherein the exposure time between the pulsing and the purging is at least 5 seconds, to obtain a polymeric substrate coated with the first metal, semimetal or semiconductor precursor and the monofunctional or oligofunctional organic molecule and infiltrated with the second metal, semimetal or semiconductor precursor, and iv) pulsing a co-reactant into the reaction chamber followed by an exposure time and then purging of the reaction chamber, wherein the exposure time between the pursing and the purging is at least 5 seconds and wherein the co-reactant reacts with the second metal, semimetal or semiconductor precursor, to obtain a polymeric substrate coated with the first metal, semimetal or semiconductor compound or element and the monofunctional or oligofunctional organic molecule and infiltrated with the second metal, semimetal or semiconductor compound or element.

In a particular embodiment, steps ii) to iv) are each repeated between 1 and 1.000 times; preferably between 50 and 1.000 times. In an embodiment the cycle of steps ii) to iii) or ii) to iv) are repeated between 1 and 1.000 times; preferably between 50 and 1.000 times. In an embodiment, steps ii) to iv) are carried out sequentially and the cycle of steps ii) to iv) is repeated between 1 and 1.000 times, preferably between 10 and 1.000 times, more preferably between 50 and 1.000 times, even more preferably between 50 and 500 times. In another embodiment, steps ii) to ii') are carried out sequentially and the cycle of steps ii) to ii') are repeated between 1 and 1.000 times, preferably between 10 and 1.000 times, more preferably between 10 and 500 times, even more preferably between 50 and 500 times; before performing step iii). In an embodiment, steps iii) and iv) are repeated, individually or sequentially, between 1 and 1.000 times, preferably between 10 and 1.000 times, more preferably between 50 and 1.000 times, even more preferably between 50 and 500 times.

In another alternative of the process of the invention, step ii) comprises pulsing the polymeric substrate with a monofunctional or oligofunctional organic molecule. In this case, one or more of the functional groups of the monofunctional or oligofunctional organic molecule reacts with the functional groups on the surface of the polymeric substrate giving rise to a non-reactive organic layer that prevents the second metal, semimetal or semiconductor precursor from binding to the surface of the polymeric substrate. Therefore, in another embodiment, the process of the invention comprises:

i) providing a polymeric substrate in a reaction chamber,
ii) pulsing a monofunctional or oligofunctional organic molecule into the reaction chamber and then purging the reaction chamber wherein there is no exposure time between the pulsing and the purging, to obtain a polymeric substrate coated with the monofunctional or oligofunctional organic molecule,
iii) pulsing a metal, semimetal or semiconductor precursor into the reaction chamber, followed by an exposure time and then purging of the reaction chamber, wherein the exposure time between the pulsing and the purging is at least 5 seconds, to obtain a polymeric substrate coated with the monofunctional or oligofunctional organic molecule and infiltrated with the second metal, semimetal or semiconductor precursor, and iv) optionally, pulsing a co-reactant into the reaction chamber followed by an exposure time and then purging of the reaction chamber, wherein the exposure time between the pursing and the purging is at least 5 seconds and wherein the co-reactant reacts with the second metal, semimetal or semiconductor precursor, to obtain a polymeric substrate coated with the monofunctional or oligofunctional organic molecule and infiltrated with the metal, semimetal or semiconductor compound or element.

In a particular embodiment, steps ii) to iv) are each repeated between 1 and 1.000 times; preferably between 50 and 1.000 times. In an embodiment the cycle of steps ii) to iii) or ii) to iv) are repeated between 1 and 1.000 times; preferably between 50 and 1.000 times. In an embodiment, steps ii) to iv) are carried out sequentially and the cycle of steps ii) to iv) is repeated between 1 and 1.000 times, preferably between 10 and 1.000 times, more preferably between 50 and 1.000 times, even more preferably between 50 and 500 times. In another embodiment, steps ii) to ii') are carried out sequentially and the cycle of steps ii) to ii') are repeated between 1 and 1.000 times, preferably between 10 and 1.000 times, more preferably between 10 and 500 times, even more preferably between 50 and 500 times; before performing step iii). In an embodiment, steps iii) and iv) are repeated, individually or sequentially, between 1 and 1.000 times, preferably between 10 and 1.000 times, more preferably between 50 and 1.000 times, even more preferably between 50 and 500 times.

Particular and preferred embodiments disclosed herein below apply to all above-mentioned processes of the invention.

In an embodiment, steps (ii) to (iv) are carried out consecutively and the cycle of steps (ii) to (iv) is repeated between 1 and 1.000 times, preferably between 10 and 1.000 times, more preferably between 10 and 500 times, even more preferably between 50 and 500 times. In this case, the resulting substrate presents a coating of a first material and is infiltrated with a second material.

In another embodiment, steps (ii) and/or ii') are carried out once and then steps (iii) and (iv) are carried out and the cycle of steps (iii) to (iv) is repeated between 1 and 1.000 times, preferably between 10 and 1.000 times, more preferably between 10 and 500 times, even more preferably between 50 and 500 times. In this case, the resulting substrate presents substantially no coating of the first material. A single coating of the first metal, semimetal or semiconductor precursor and/or the monofunctional or oligofunctional organic molecule can be sufficient to inhibit coating by the second metal, semimetal or semiconductor precursor.

In the context of the invention the term "polymeric substrate" refers to an organic based polymeric material that may be coated and infiltrated such as polymers, biopolymers, hybrid materials, layered structures and combinations thereof.

In an embodiment, the polymeric substrate is an organic based polymer. In an embodiment, it can be selected from homopolymers, copolymers, multicomponent polymers or combinations thereof.

In an embodiment of the invention, the polymeric substrate of the present invention comprises an organic polymer having one or more functional groups selected from hydroxyl, ether, amino, ketone, halogen, carboxylic acid, ester, amide, acid halide, imide, imine, acrylate, terephthalate, alkenyl, and aryl.

In a particular embodiment, the polymeric substrate is selected from polyamides, polyamines, polyimides, polyalkylenes, polyacrylates, polyalcohols, polyethers, polyesters, polyvinyls, polypyrroles, polythiophenes, polystyrenes and polyketones. In a further embodiment, the polymeric substrate of the present invention is selected from polyamides, polyamines, polyimides, polyalkylenes, polyacrylates, polymethacrylates, polyalcohols, polyethers, polyesters, polyvinyls, halopolymers, polypyrroles, polythiophenes, polystyrenes and polyketones; preferably is selected from aromatic polyamides, nylon, polyaniline, polystyrene, polypropylene, poly(butyl methacrylate), poly(propyl methacrylate), poly(ethyl methacrylate), poly(methyl methacrylate), polybutylene terephthalate, polyethylene terephthalate, polyvinyl alcohol, polyvinyl chloride, polytetrafluoroethylene, polychlorotrifluoroethylene, polyimide, polyetherimide and polyetheretherketone; more preferably it is selected from aromatic polyamide (aramids), such as para-aramid and meta-aramid polymers; even more preferably it is poly paraphenylene terephthalamide.

In an embodiment, the polymeric substrate is Kevlar or Kevlar fibers.

In another particular embodiment, the polymeric substrate can be selected from homopolymers and copolymers, including alternating copolymers, block copolymers and random copolymers.

In another embodiment, the polymeric substrate can alternatively be an inorganic-organic hybrid polymer or a blend of organic polymer and inorganic-organic hybrid material. Inorganic-organic hybrid polymers can be prepared by conventional methods from the prior art.

In an embodiment, the biopolymers are selected from polypeptides, nucleic acids and polysaccharides, such as starch, pectin, chitosan, alginate, carrageenan, cellulose and cellulose derivatives (e.g. methylcellulose, hydroxymethyl cellulose, hydroxypropyl cellulose, carboxymethyl cellulose).

In a particular embodiment, the polymeric substrate of the present invention comprises one or more layers, such as one or more layers of different polymers.

In another embodiment, the polymeric substrate of the present invention is porous; preferably having macro porosity or microporosity.

In a particular embodiment, the polymeric substrate of the present invention is in the form of spheres, cylinders, lamellae, films, fibers and bicontinuous structures; preferably it is a polymeric fiber.

In an embodiment, the polymeric substrate has a thickness between 1 and 250 µm, preferably between 1 and 100 µm, more preferably between 1 and 50 µm. In another embodiment, the polymeric substrate has a length between 0.5 and 40 cm, preferably between 0.5 and 20 cm, more preferably between 1 and 10 cm, even more preferably between 1 and 8 cm.

In an embodiment, the polymeric substrate is a polymeric fiber with a diameter of between 1 and 100 µm, preferably between 1 and 50 µm, more preferably between 2 and 30 µm, even more preferably between 5 and 20 µm. In another embodiment, the polymeric substrate is a polymeric fiber with a diameter of between 1 and 100 µm, preferably between 2 and 20 µm, and a length between 0.5 and 40 cm, preferably between 0.5 and 10 cm.

Non-limiting examples of individual fibers suitable for the present invention include straight, crimped or roving fibers.

In a particular embodiment, the reaction chamber of the present invention is arranged for gas-to-surface reactions. Preferably, the expression "reaction chamber" refers to the chamber of a chemical vapor processing apparatus as known in the art such as a chemical vapor deposition (CVD), vapor phase infiltration (VPI) or atomic layer deposition (ALD) apparatus. Preferably the reaction chamber of the present invention is an atomic layer deposition reaction chamber such as those available from Cambridge Nanotech Inc. of Cambridge, Mass. In an embodiment, the reaction chamber is an atomic layer deposition chamber.

All the reagents used in the process of the invention (metal, semimetal or semiconductor precursor, monofunctional or oligofunctional organic molecule, co-reactant, purge gas) are injected or pulsed in the reaction chamber in the form of gas.

In the context of the present invention the term "pulse" is related to the period of time wherein a compound such as a metal, semimetal or semiconductor precursor, an organic molecule, water or any other reactant or co-reactant is dosed into the reaction chamber. In this sense, the term "pulsing" refers to dosing a compound into the reaction chamber of the present invention during a (short) period of time. The pulsing time may be adapted by the expert in the art lasting from a few hundredths of a second to several seconds, depending on the precursor, type of reactor, volume of the chamber, etc.

In a particular embodiment, pulsing times are independently between 0.01 and 20 seconds; preferably between 0.01 and 10 seconds, more preferably between 0.01 and 5 seconds, even more preferably between 0.01 and 2 seconds. In a further embodiment, pulsing times are independently between 0.01 and 1 second, preferably between 0.02 and 0.50 seconds, more preferably between 0.02 and 0.15 seconds; even more preferably between 0.05 and 0.1 seconds.

In the context of the present invention the term "purge" is related to the period of time wherein any non-reacted compound in the reaction chamber is removed. The purging time may be adapted by the expert in the art depending on the precursor, reaction chamber characteristics, pulsing time, etc. and may last from a few seconds to several minutes per cycle. In a particular embodiment, the purging of the present invention is performed by flowing a purge gas through the said reaction chamber or by evacuating said reaction chamber by means of vacuum; preferably by flowing an inert purge gas. In an embodiment, the inert purge gas is selected from nitrogen, argon, helium, neon, and mixtures thereof; preferably it is nitrogen.

In a particular embodiment, purging times are independently between 1 and 300 seconds; preferably between 1 and 200 seconds, more preferably between 5 and 200 seconds, even more preferably between 5 and 200 seconds. In a further embodiment, pulsing times are independently between 5 and 150 second, preferably between 5 and 90 seconds, more preferably between 10 and 60 seconds; even more preferably between 20 and 40 seconds.

In the context of the present invention the term "exposure time" is related to the period of time or "hold" time wherein a static atmosphere or a non-flowing atmosphere inside the chamber is created and a compound or a mixture of compounds previously introduced in the chamber (by one or more pulses) are able to diffuse into the sub-surface of the polymeric substrate. Exposure time may be adapted by the expert in the art depending on the polymeric substrate characteristics, precursor, density of the polymeric substrate, desired infiltration depth, etc. It may last from a few seconds to a few minutes. In special cases it may last for hours. As used in the art, exposure time generally refers to the time between the end of pulsing and the start of purging.

In a particular embodiment, exposure times are at least 5 seconds; preferably between 5 and 300 seconds; more preferably between 1 and 200 seconds, more preferably between 5 and 200 seconds, even more preferably between 5 and 200 seconds. In a further embodiment, exposure times are between 5 and 150 second, preferably between 5 and 90 seconds, more preferably between 10 and 60 seconds; even more preferably between 20 and 40 seconds.

The expression "wherein there is no exposure time between the pulsing and the purging" or "with no exposure time between the pulsing and the purging" means that step ii) or ii') is performed without setting a time delay between the pulsing and the purging, i.e. that the pulsing is performed immediately or right after the purging. Preferably, the time interval between the pulsing and the purging is zero or substantially zero seconds, i.e. it is as close to zero seconds as allowed by the error margin of the system used to carry out the process. In a particular embodiment, it means that the exposure time between the pulsing and the purging is less than 0.01 seconds, preferably less than 0.001 seconds.

Monofunctional or oligofunctional organic molecules, i.e. organic molecules with one or several functional groups, can be used in all the embodiments of the invention as long as the non-binding part is inert with respect to (i.e. does not react with) the second metal, semimetal or semiconductor precursor. Suitable monofunctional or oligofunctional organic molecules can be determined by the skilled person in view of the polymeric substrate, first precursor and second precursor used. In an embodiment, the monofunctional or oligofunctional organic molecule does not comprise a metal, semimetal or semiconductor element. Preferably, the monofunctional or oligofunctional organic molecule is a monofunctional organic molecule.

In an embodiment, the monofunctional or oligofunctional organic molecule of step (ii) or (ii') is an organic molecule with at least one functional group selected from hydroxyl, amino, carboxylic acid, ester, amido, silane, thiol, epoxy, nitro and acid halide. Preferably it is an organic molecule having between one and three functional groups; more preferably it is a bifunctional (with two functional groups) or monofunctional (with one functional group); more preferably is a monofunctional organic molecule.

In a more particular embodiment, the monofunctional or oligofunctional organic molecule of step (ii) or (ii') is an aliphatic or aromatic monofunctional or oligofunctional organic molecule; preferably an aliphatic molecule. In a preferred embodiment, the monofunctional or oligofunctional organic molecule is a $C_1$-$C_{12}$ alkane, a perfluorinated compound or a $C_6$-$C_{18}$ arene substituted with at least one functional group selected from hydroxyl, amino, carboxylic acid, sulfonic acid, ester, ether, amido, halogen, silane, thiol, halide, epoxy and acid halide. In an embodiment, the monofunctional or oligofunctional organic molecule is a $C_1$-$C_{12}$ alkanol.

In another embodiment, the monofunctional or oligofunctional organic molecule is a monofunctional or oligofunctional perfluorinated compound, preferably a perfluorinated $C_1$-$C_{12}$ alkane, perfluorinated $C_2$-$C_{12}$ alkene or perfluorinated $C_6$-$C_{18}$ arene.

In an embodiment, the monofunctional or oligofunctional organic molecules is a monofucntional organic molecule, preferably an organic molecule with one functional group selected from hydroxyl, amino, carboxylic acid, ester, amido, silane, thiol, epoxy, nitro and acid halide. In an embodiment, it is an aliphatic or aromatic monofunctional organic molecule; preferably an aliphatic molecule. In a preferred embodiment, the monofunctional organic molecule is a $C_1$-$C_{12}$ alkane, a perfluorinated compound or a $C_6$-$C_{18}$ arene substituted with one functional group selected from hydroxyl, amino, carboxylic acid, sulfonic acid, ester, ether, amido, halogen, silane, thiol, halide, epoxy and acid halide. In an embodiment, the monofunctional organic molecule is a $C_1$-$C_{12}$ alkanol. In another embodiment, the monofunctional organic molecule is a monofunctional perfluorinated compound, preferably a perfluorinated $C_1$-$C_{12}$ alkane, perfluorinated $C_2$-$C_{12}$ alkene or perfluorinated $C_6$-$C_{18}$ arene; more preferably a perfluorocaboxylic acid such as trifluoroacetic acid, heptafluorobutyric acid, pentafluorobenzoic acid, perfluorooctanoic acid or perfluorononanoic acid. The first metal, semimetal or semiconductor precursor or the monofunctional or oligofunctional organic molecule of step (ii) of the present invention are able to react with the functional groups of the polymeric substrate surface. Thus, in a particular embodiment, the first metal, semimetal or semiconductor precursor or the monofunctional or oligofunctional organic molecule of step (ii) binds to the functional groups of the surface of the polymeric substrate.

In an embodiment, the coated polymeric substrate obtained after step (ii) comprises a coating layer on the surface of the polymeric substrate, of the first metal, semimetal or semiconductor precursor or of the monofunctional or oligofunctional organic molecule. Preferably wherein said first metal, semimetal or semiconductor precursor or said monofunctional or oligofunctional organic molecule are bonded to the functional groups of the polymeric substrate surface; more preferably, wherein said first metal, semimetal or semiconductor precursor or said monofunctional or oligofunctional organic molecule are bonded to all the functional groups of the polymeric substrate surface.

Complete saturation of the surface of the polymeric substrate after step (ii) or (ii') can be controlled, for instance, by using an excess amount of the first metal, semimetal or semiconductor precursor and/or monofunctional or oligofunctional organic molecule to assure reaction of all the functional groups of the surface of the polymeric substrate. Since no exposure time between pulsing and purging is allowed in steps (ii) and (ii'), the unreacted excess amount does not infiltrate the polymeric substrate, but is purged. Alternatively, saturation of the surface of the polymeric substrate can be achieved by repeating step (ii) and/or (ii') several times before until all the functional groups of the surface of the polymeric substrate have reacted, before performing step (iii).

In a particular embodiment step (ii), or the cycle of steps (ii) to (ii'), is repeated at least twice, preferably at least 5 times; preferably between 1 and 1000 times; more preferably between 5 and 500 times; even more preferably between 10 and 200 times. Therefore, by repeating the step (ii) the surface of the polymeric substrate is saturated by the first metal, semimetal or semiconductor precursor and/or by the monofunctional or oligofunctional organic molecule.

When a first metal, semimetal or semiconductor precursor is used in step (ii), thickness of the coating layer can be controlled, for instance, by controlling the number of repetitions of the cycle of steps (ii) to (iv) or to (v).

The first metal, semimetal or semiconductor precursor is different from the second metal, semimetal or semiconductor precursor. More preferably, the metal in the first metal, semimetal or semiconductor precursor is different from the metal in the second metal, semimetal or semiconductor precursor.

In a particular embodiment, the first and second metal, semimetal or semiconductor precursors of the present invention are independently selected from metal halides, metal alkoxides, metal alkyls, metal diketonates, metal alkylamides, metal amidinates, metal aryls and cyclopentadienyl metals; preferably are independently selected from metal halides and metal alkoxides; more preferably form metal alkoxides.

In the context of the present invention the term "metal" refers to what is commonly understood in the art, and includes earth metals, alkaline earths, transition metals, lanthanides, actinides and other metals such as B, Al, Ga, In, TI, Nh, Sn, Pb, Fl, Mc and Lv. In the context of the present invention, the term "semimetal" or metalloid refers to what is commonly understood in the art and includes As, Sb, Te, Se and Bi. In the context of the present invention, the term "semiconductor" refers to what is commonly understood in the art and includes Ge and Si.

In a particular embodiment, the first and second metal, semimetal or semiconductor precursors of the present invention comprise independently a metal selected from Al, Zn, Si, Ti, W, Sb, As, Ba, Bi, B, Cd, Ca, Ce, Cr, Co, Cu, Er, Eu, Gd, Ga, Ge, Hf, Fe, La, Mg, Mn, Mo, Ni, Nb, Os, Pt, Pr, Re, Rh, Ru, Sm, Se, Si, Sr, Ta, Te, Tb, Tm, Sn, Ti, W, V, Yb, Y, Zr, Pd, In, Ir and Li; preferably are selected from Al, Zn, Si, Ti and In.

Non-limiting examples of first and second metal, semimetal or semiconductor precursors suitable for the present invention are trimethylaluminum, triisobutylaluminum, aluminum tris(2,2,6,6-tetramethyl-3,5-heptanedionate), tris(dimethylamido)aluminum, aluminum trichloride, triphenylantimony, tris(dimethylamido)antimony, antimony pentachloride, triphenylarsine, triphenylarsine oxide, barium bis(2,2,6,6-tetramethyl-3,5-heptanedionate), barium nitrate, bis(pentamethylcyclopentadienyl)barium, bis(triisopropylcyclopentadienyl)barium, bis(aceto-O)triphenylbismuth, tris(2-methoxyphenyl)bismuthine, triisopropyl borate, triphenylborane, tris(pentafluorophenyl)borane, cadmium acetylacetonate, dimethyl cadmium, calcium bis(2,2,6,6-tetramethyl-3,5-heptanedionate), tris(tetramethylcyclopentadienyl) cerium (III), bis(cyclopentadienyl)chromium (II), bis(pentamethylcyclopentadienyl)chromium (II), chromium (III) tris(2,2,6,6-tetramethyl-3,5-heptanedionate), bis(cyclopentadienyl)cobalt (II), bis(pentamethylcyclopentadienyl)cobalt (II), bis(ethylcyclopentadienyl)cobalt (II), cobalt tris(2,2,6,6-tetramethyl-3,5-heptanedionate), copper bis(2,2,6,6-tetramethyl-3,5-heptanedionate), copper bis(6,6,7,7,8,8,-heptafluoro-2,2-dimethyl-3,5-octanedioate), copper hexafluoroacetylacetonate, bis(N,N'-diisopropylacetamidinato)copper(I), erbium tris(2,2,6,6-tetramethyl-3,5-heptanedionate), tris(N,N-bis(trimethylsilyl)amide) europium (III), tris(tetramethylcyclopentadienyl)europium (III), tris(N,N-bis(trimethylsilyl)amide)gadolinium (III), tris(tetramethylcyclopentadienyl)gadolinium (III), tris(cyclopentadienyl)gadolinium (III), triethylgallium, trimethylgallium, tris(dimethylamido)gallium (III), hexamethyldigermanium (IV), tetramethylgermanium, tributylgermanium hydrige, triethylgermanium hydride, triphenylgermanium hydride, bis(methyl-η$^5$-cyclopentadienyl)methoxymethylhafnium, bis(trimethylsilyl)amidohafnium(IV) chloride, d imethylbis(cyclopentadienyl)hafnium (IV), hafnium(IV) tert-butoxide, hafnium isopropoxide, etrakis(diethylamido)hafnium, etrakis(dimethylamido)hafnium, tetrakis(ethylmethylamido)hafnium(IV), [1,1'-bis(diphenylphosphino)ferrocene]tetracarbonylmolybdenum(0), bis(pentamethylcyclopentadienyl)iron(II), 1,1'-diethylferrocene, iron(0) pentacarbonyl, iron(III) tris(2,2,6,6-tetramethyl-3,5-heptanedionate), cyclohexadiene iron tricarbonyl, ferrocene, lanthanum(III) isopropoxide, tris (N,N-bis(trimethylsilyl)amide)lanthanum(III), tris(cyclopentadienyl)lanthanum (III), tris(tetramethylcyclopentadienyl)lanthanum (III), tris(isopropylcyclopentadienyl)lanthanum(III), bis(cyclopentadienyl)magnesium (II), bis(pentamethylcyclopentadienyl)magnesium, bis(pentamethylcyclopentadienyl)manganese (II), bis(tetramethylcyclopentadienyl)manganese (II), bromopentacarbonylmanganese(I), cyclopentadienylmanganese(I) tricarbonyl, manganese(0) carbonyl, (bicyclo[2.2.1]hepta-2,5-diene)tetracarbonylmolybdenum(0), bis(cyclopentadienyl)molybdenum(IV) dichloride, cyclopentadienylmolybdenum(II) tricarbonyl, molybdenumhexacarbonyl, (propylcyclopentadienyl)molybdenum(I) tricarbonyl dimer, molybdenum hexafluoride, allyl(cyclopentadienyl)nickel(II), bis(cyclopentadienyl)nickel(II), bis(ethylcyclopentadienyl)nickel(II), bis(triphenylphosphine)nickel(II) dichloride, nickel(II) bis(2,2,6,6-tetramethyl-3,5-heptanedionate), nickel(II) acetylacetonate, bis(cyclopentadienyl)niobium(IV) dichloride, niobium pentafluoride, niobium pentachloride, niobium pentethoxide, niobium(V) iodide, triosmium dodecacarbonyl, trimethyl(methylcyclopentadienyl)platinum(IV), praseodymium (III) hexafluoroacetylacetonate, dirhenium decacarbonyl, (acetylacetonato)(1,5-cyclooctadiene)rhodium(I), bis(cyclopentadienyl)ruthenium(II), bis(ethylcyclopentadienyl)ruthenium(II), triruthenium dodecacarbonyl, tris(tetramethylcyclopentadienyl)samarium(III), dimethyl selenide, (3-aminopropyl)triethoxysilane, N-sec-butyl(trimethylsilyl)amine, chloropentamethyldisilane, 1,2-dichlorotetramethyldisilane, 1,3-diethyl-1,1,3,3-tetramethyldisilazane, dodecamethylcyclohexasilane, hexamethyldisilane, hexamethyldisilazane, 2,4,6,8,10-pentamethylcyclopentasiloxane, pentamethyldisilane, silicon tetrabromide, silicon tetrachloride, tetraethylsilane, 2,4,6,8-tetramethylcyclotetrasiloxane, 1,1,2,2-tetramethyldisilane, N,N',N"-tri-tert-butylsilanetriamine, tris(tert-butoxy)silanol, tris(tert-pentoxy)silanol, disilane, strontium tetramethylheptanedionate, bis(pentamethylcyclopentadienyl) strontium, pentakis(dimethylamino)tantalum(V), tantalum(V) ethoxide, tris(diethylamido)(tert-butylimido)tantalum(V), tris(ethylmethylamido)(tert-butylimido)tantalum(V), tellurium tetrachloride, terbium(III) tris(2,2,6,6-tetramethyl-3,5-heptanedionate), tris(cyclopentadienyl)terbium(III), tris(tetramethylcyclopentadienyl)terbium(III), tris(N,N-bis(trimethylsilyl)amide)thulium(III), tris(cyclopentadienyl)thulium(III), bis[bis(trimethylsilyl)amino]tin(II), hexaphenylditin(IV), tetraallyltin, tetrakis(diethylamido)tin, tetrakis(dimethylamido)tin, tin(IV) iodide, tetramethyltin, tetravinyltin, tin (II) acetylacetonate, trimethyl(phenylethynyl)tin, trimethyl(phenyl)tin, tetrakis(diethylamido)titanium(IV), tetrakis(dimethylamido)titanium(IV), tetrakis(ethylmethylamido)titanium(IV), titanium(IV) diisopropoxide bis(2,2,6,6-tetramethyl-3,5-heptanedionate), titanium(IV) isopropoxide, titanium tetrachloride, bis(tert-butylimino)bis(tert-butylamino)tungsten, bis(tert-butylimino)bis(dimethylamino)tungsten(VI), bis(cyclopentadienyl)tungsten(IV) dichloride, bis(cyclopentadienyl)tungsten(IV), tungsten hexafluoride, bis(isopropylcyclopentadienyl)tungsten(IV), tetracarbonyl(1,5-cyclooctadiene)tungsten(0), triamminetungsten(IV) tricarbonyl, tungsten hexacarbonyl, bis(cyclopentadienyl)vanadium(II), bis(ethylcyclopentadienyl)vanadium(II), vanadium(V) oxytriisopropoxide, tris(N,N-bis(trimethylsilyl)amide)ytterbium(III), tris(cyclopentadienyl)ytterbium(III), tris(N,N-bis(trimethylsilyl)amide)yttrium, tris(butylcyclopentadienyl)yttrium(III), tris(cyclopentadienyl)yttrium(III), yttrium 2-methoxyethoxide, yttrium(III) tris(isopropoxide), yttrium(III) tris(2,2,6,6-tetramethyl-3,5-heptanedionate), bis(pentafluorophenyl)zinc, bis(2,2,6,6-tetramethyl-3,5-heptanedionate)zinc(II), diethylzinc, diphenylzinc, bis(cyclopentadienyl)zirconium(IV), bis(cyclopentadienyl)dimethylzirconium, bis(methyl-η$^5$- cyclopentadienyl)methoxymethylzirconium, dimethylbis (pentamethylcyclopentadienyl)zirconium (IV), tetrakis (diethylamido)zirconium(IV), tetrakis(dimethylamido) zirconium(IV), tetrakis(ethylmethylamido)zirconium(IV), zirconium(IV) dibutoxide(bis-2,4-pentanedionate), zirconium(IV) 2-ethylhexanoate, zirconium tetrakis(2,2,6,6-tetramethyl-3,5-heptanedionate), palladium (II) hexafluoroacetylacetonate, cyclopentadienyl indium, trimethyl indium, iridium (III) acetylacetonate and lithium tert-butoxide.

In a preferred embodiment, the first and second metal, semimetal or semiconductor precursors of the present invention are independently selected from trimethylaluminum, triisobutylaluminum, aluminum tris(2,2,6,6-tetramethyl-3, 5-heptanedionate), tris(dimethylamido)aluminum, aluminum trichloride, triphenylantimony, bis(pentafluorophenyl) zinc, bis(2,2,6,6-tetramethyl-3,5-heptanedionate)zinc(II), diethylzinc, diphenylzinc, tetrakis(diethylamido)titanium (IV), tetrakis(dimethylamido)titanium(IV), tetrakis(ethylmethylamido)titanium(IV), titanium(IV) diisopropoxide bis (2,2,6,6-tetramethyl-3,5-heptanedionate), titanium(IV) isopropoxide, titanium tetrachloride, and cyclopentadienyl indium, trimethyl indium.

In a particular embodiment, the exposure time between the pulsing and the purging in steps (iii) and (iv) is at least 5 seconds; preferably is between 5 and 300 seconds; more preferably between 10 and 180 seconds, more preferably between 20 and 60 seconds; even more preferably between 20 and 40 seconds.

In the context of the present invention the term "infiltrate" or "infiltration" relates to the diffusion of a precursor such as a metal, semimetal or semiconductor precursor particularly in a gaseous state into/within the polymer substrate. Said precursor may react with the functional groups in the polymer substrate. In a particular embodiment, the precursor reacts with the functional groups of the polymer substrate, in particular said reaction does not degrade the polymer.

The thickness of the infiltration layer in the organic inorganic hybrid material can be controlled by controlling the exposure time in step (iii). On the other hand, the density of the infiltration layer can be controlled by the number of repetitions of step (iii). All these parameters can be controlled by the skilled person, depending on the polymeric substrate and the precursors used, in order to obtain a final material with the desired density and thickness of infiltration layer. In a particular embodiment, the thickness of the infiltration layer is understood as the depth reached by the infiltration layer in the polymer.

In a particular embodiment, the second metal, semimetal or semiconductor precursor of step (iii) is infiltrated into the coated polymeric substrate of step (ii) or (ii') and binds to the functional groups within the polymeric substrate; preferably within the bulk of the polymeric substrate.

In an embodiment, the second metal, semimetal or semiconductor precursor of step (iii) is not able to react with the coating layer obtained in step (ii) or (ii'). In a particular embodiment the second metal, semimetal or semiconductor precursor of step (iii) is not able to react with the first metal, semimetal or semiconductor precursor and/or with the monofunctional or oligofunctional organic molecule bonded to the functional groups on the surface of the polymeric substrate surface and thus, it diffuses within the bulk of the coated polymeric substrate.

In an embodiment, the coated and infiltrated polymeric substrate obtained in step (iii) comprises:
a coating layer on the surface of the polymeric substrate of the first metal, semimetal or semiconductor precursor, of the monofunctional or oligofunctional organic molecule, or of the first metal, semimetal or semiconductor compound or element and the monofunctional or oligofunctional organic molecule; and
an infiltration layer within the polymeric substrate of the second metal, semimetal or semiconductor precursor;
preferably wherein said first metal, semimetal or semiconductor precursor or said monofunctional or oligofunctional organic molecule are bonded to the functional groups of the polymeric substrate surface and the second metal, semimetal or semiconductor precursor is bonded to functional groups in the bulk of the polymeric substrate;
and more preferably, wherein said first metal, semimetal or semiconductor precursor or said monofunctional or oligofunctional organic molecule are bonded to all the functional groups of the polymeric substrate surface and the second metal, semimetal or semiconductor precursor is bonded to functional groups in the bulk of the polymeric substrate.

The term co-reactant refers to a compound that activates the metal, semimetal or semiconductor precursor, modifies the metal, semimetal or semiconductor precursor, or catalyzes a reaction of the metal, semimetal or semiconductor precursor, to convert it into the desired metal, semimetal or semiconductor compound or element that incorporates into the polymeric substrate to form either a coating layer or an infiltration layer. Suitable co-reactants are well-known in the art.

In a particular embodiment the co-reactant of step (iv) or step (v) is selected from an oxygen source, a hydrogen source, a sulfur source and a nitrogen source; preferably an oxygen source. In a more particular embodiment the co-reactant of step (iv) or step (v) is selected from $H_2O$, $O_2$, $O_3$, hydrogen, $BH_3$, $B_2H_6$, $H_2S$, a metal hydride, $NH_3$ and a hydrazine; preferably it is $H_2O$, $O_2$ or $O_3$; more preferably it is $H_2O$.

In a particular embodiment, the co-reactant of step (iv) or step (v) reacts with the first metal, semimetal or semiconductor precursor and/or with the second metal, semimetal or semiconductor precursor to provide a metal, semimetal or semiconductor compound or element independently selected from a metal oxide, a metal nitride, metal sulfide and a zero valent metal; preferably a metal oxide.

In an embodiment, the coated and infiltrated polymeric substrate obtained in step (iv) or step (v) comprises:
a coating layer on the surface of the polymeric substrate of the first metal, semimetal or semiconductor compound or element, of the monofunctional or oligofunctional organic molecule, or of the first metal, semimetal or semiconductor compound or element and the monofunctional or oligofunctional organic molecule; and
an infiltration layer within the polymeric substrate comprising the second metal, semimetal or semiconductor compound or element;
wherein the first and the second metal, semimetal or semiconductor compound or element are different and wherein said coating layer does not comprise said second metal, semimetal or semiconductor compound or element.

In a particular embodiment, the coating layer comprising the first metal, semimetal or semiconductor compound or element and/or the infiltration layer comprising the second metal, semimetal or semiconductor compound or element comprises a metal selected from Al, Zn, Si, Ti and In. In a more particular embodiment, the coating layer comprising the first metal, semimetal or semiconductor compound or element and/or the infiltration layer comprising the second metal, semimetal or semiconductor compound or element comprise a metal oxide, preferably a metal oxide independently selected from $Al_2O_3$, ZnO, $SiO_2$, $TiO_2$ and $In_2O_3$; more preferably selected from $Al_2O_3$, ZnO, $TiO_2$ and $In_2O_3$.

In a particular embodiment, the co-reactant is an oxygen source, preferably $H_2O$, and the metal, semimetal or semiconductor compound or element coating and/or infiltrating the polymeric substrate is a metal oxide, preferably $Al_2O_3$, ZnO, $SiO_2$, $In_2O_3$ or $TiO_2$; more preferably selected from $Al_2O_3$, ZnO, $TiO_2$ and $In_2O_3$.

In a particular embodiment the metal, semimetal or semiconductor compound or element is a metal, semimetal or semiconductor comprising at least one metallic, semimetallic or semiconductor element and at least one another element. In another embodiment, it is a metallic, semimetallic or semiconductor element with oxidation state zero.

In a particular embodiment, the process of the present invention is performed at a temperature between 50 and 300° C.; preferably at between 100 and 200° C., more preferably at around 150° C. In an embodiment, the process of the present invention is performed at a pressure of between 1 mbar and 1034 mbar; preferably between 100 mbar and 800 mbar; more preferably between 500 mbar and 700 mbar. In a more particular embodiment, the process of the present invention is performed under a constant nitrogen gas flow of between 10 and 500 standard cubic centimeters per minute (sccm); preferably between 15 and 50 standard cubic centimeters per minute (sccm); more preferably at 20 standard cubic centimeters per minute (sccm).

In a particular embodiment, the coating layer of the present invention has a thickness of between 1 and 200 nm; preferably between 5 and 100 nm; more preferably between 10 and 50 nm.

In a particular embodiment, the infiltration layer of the present invention has a thickness of between 1 and 1000 nm; preferably between 5 and 500 nm; more preferably between 10 and 100 nm.

In a more particular embodiment, the process of the present invention comprises:
i) providing an aromatic polyamide substrate in a reaction chamber; preferably a poly paraphenylene terephthalamide substrate;
ii) pulsing a first metal, semimetal or semiconductor precursor selected from trimethylaluminum (TMA), titanium tetra-isopropoxide (TTIP), diethylzinc (DEZ) and trimethyl indium into the reaction chamber and, then, purging the reaction chamber wherein there is no exposure time between the pulsing and the purging, to obtain a polymeric substrate coated with trimethylaluminum (TMA), titanium tetra-isopropoxide (TTIP), diethylzinc (DEZ) or trimethyl indium,
iii) pulsing a second metal, semimetal or semiconductor precursor selected from trimethylaluminum (TMA), titanium tetra-isopropoxide (TTIP), diethylzinc (DEZ) and trimethyl indium into the reaction chamber, followed by an exposure time and then purging of the reaction chamber, wherein the exposure time between the pulsing and the purging is at least 5 seconds, to obtain a polymeric substrate coated with a first metal, semimetal or semiconductor precursor selected from trimethylaluminum (TMA), titanium tetra-isopropoxide (TTIP), diethylzinc (DEZ) and trimethyl indium and infiltrated with a first metal, semimetal or semiconductor precursor selected from trimethylaluminum (TMA), titanium tetra-isopropoxide (TTIP), diethylzinc (DEZ) and trimethyl indium, and
iv) pulsing water into the reaction chamber followed by an exposure time and then purging of the reaction chamber, wherein the exposure time between the pulsing and the purging is at least 5 seconds and wherein the water reacts with the first and with the second metal, semimetal or semiconductor precursor, to obtain a polymeric substrate with a coating layer selected from $Al_2O_3$, $TiO_2$, ZnO and $In_2O_3$ and infiltrated with inorganic features selected from $Al_2O_3$, $TiO_2$, ZnO and $In_2O_3$;

provided that the metal, semimetal or semiconductor compound or element of the coating layer and the metal, semimetal or semiconductor compound or element of the infiltration layer are different.

In another particular embodiment, the process of the present invention comprises:
i) providing an poly paraphenylene terephthalamide substrate in a reaction chamber,
ii) pulsing trimethylaluminum (TMA) into the reaction chamber and, then, purging the reaction chamber wherein there is no exposure time between the pulsing and the purging, to obtain a polymeric substrate coated with trimethylaluminum (TMA),
iii) pulsing a diethylzinc (DEZ) into the reaction chamber, followed by an exposure time and then purging of the reaction chamber, wherein the exposure time between the pulsing and the purging is between 10 and 50 seconds, to obtain a polymeric substrate coated with trimethylaluminum (TMA) and infiltrated with diethylzinc (DEZ), and
iv) optionally, pulsing water into the reaction chamber followed by an exposure time and then purging of the reaction chamber, wherein the exposure time between the pulsing and the purging is between 10 and 50 seconds and wherein the water reacts with and with the second metallic precursor, to obtain a polymeric substrate coated with $Al_2O_3$, and infiltrated with ZnO.

In a particular embodiment, the cycle of steps (ii) to (iii) or (ii) to (iv) or (ii) to (v) of the process of the present invention in any of its particular embodiments is repeated at least 50 times; preferably between 1 and 1000 times; more preferably between 10 and 400 times; even more preferably between 50 and 300 times.

In a particular embodiment, each step of the process of the present invention in any of its particular embodiments is independently repeated a desired number of times; preferably at least twice; more preferably at between 2 and 200 times; even more preferably between 5 and 100 times.

In a particular embodiment, the process of the invention consists of steps (i)-(iv) or (i)-(v) as disclosed herein. However, the process of the invention can also comprise further steps of pulsing with other precursors to add further infiltrated materials and thus create sections of different composition in the subsurface area of the polymeric substrate. The process can also comprise further steps of pulsing with other precursors or reactants to add further coated materials on the surface of the polymeric substrate.

In a second aspect the invention is directed to an organic-inorganic hybrid material obtainable by the process of the present invention in any of its embodiments above.

In a third aspect, the present invention is directed to an organic inorganic hybrid material comprising:
a polymeric substrate,
a coating layer on the surface of the polymeric substrate, wherein said coating layer comprises a first metal, semimetal or semiconductor compound or element or a monofunctional or oligofunctional organic molecule or a mixture thereof, and an infiltration layer within the polymeric substrate, wherein said infiltration layer comprises a second metal, semimetal or semiconductor compound or element, wherein the first and the second metal, semimetal or semiconductor compound or element are different and wherein said coating layer does not comprise said second metal, semimetal or semiconductor compound or element.

In a particular embodiment, the organic-inorganic hybrid material of the present invention comprises:

a polymeric substrate, a coating layer on the surface of the polymeric substrate, wherein said coating layer comprises a first metal, semimetal or semiconductor compound or element, and an infiltration layer within the polymeric substrate, wherein said infiltration layer comprises a second metal, semimetal or semiconductor compound or element.

In another particular embodiment, the organic-inorganic hybrid material of the present invention comprises:

a polymeric substrate, a coating layer on the surface of the polymeric substrate, wherein said coating layer comprises a first layer in contact with the surface of the polymeric substrate comprising a first metal, semimetal or semiconductor compound or element, and a second layer in contact with the first layer and comprising a monofunctional or oligofunctional organic molecule, and an infiltration layer within the polymeric substrate, wherein said infiltration layer comprises a second metal, semimetal or semiconductor compound or element.

In an alternative particular embodiment the organic-inorganic hybrid material of the present invention comprises:

a polymeric substrate, a coating layer on the surface of the polymeric substrate, wherein said coating layer comprises a monofunctional or oligofunctional organic molecule, and an infiltration layer within the polymeric substrate, wherein said infiltration layer comprises a metal, semimetal or semiconductor compound or element.

Particular and preferred embodiments for the polymeric substrate, coating layer, infiltration layer, first metal, semimetal or semiconductor compound or element, second metal, semimetal or semiconductor compound or element and monofunctional or oligofunctional organic molecule in relation to the organic inorganic hybrid material are as defined above for the process of the invention.

In a particular embodiment, the coating layer of the organic-inorganic hybrid material of the present invention comprises a metal, semimetal or semiconductor compound or element selected from metal oxides, metal nitrides, and metallic state metals; preferably metal oxides; more preferably $Al_2O_3$, ZnO, $In_2O_3$ or $TiO_2$. In preferred embodiment, the coating layer comprises $Al_2O_3$.

In a particular embodiment, the infiltration layer of the organic-inorganic hybrid material of the present invention comprises a metal, semimetal or semiconductor compound or element selected from metal oxides, metal nitrides, and metallic state metals; preferably metal oxides; more preferably $Al_2O_3$, ZnO, $In_2O_3$ or $TiO_2$. In a preferred embodiment, the infiltration layer comprises ZnO.

In a preferred embodiment, the organic inorganic hybrid material of the present invention comprises:

an aromatic polyamide substrate; preferably a poly paraphenylene terephthalamide substrate, a coating layer selected from $Al_2O_3$, ZnO, $In_2O_3$ and $TiO_2$ on the surface of the substrate, and an infiltration layer comprising $Al_2O_3$, ZnO, $In_2O_3$ or $TiO_2$ within the substrate; wherein the coating layer and the infiltration layer materials are different.

In a more preferred embodiment, the organic inorganic hybrid material of the present invention comprises:

a poly paraphenylene terephthalamide substrate, a coating layer of $Al_2O_3$ on the surface of the poly paraphenylene terephthalamide substrate, and an infiltration layer comprising ZnO within the paraphenylene terephthalamide substrate.

In a particular embodiment, the coating layer of the organic-inorganic hybrid material of the present invention has a thickness of between 0.06 nm and 200 nm; preferably between 1 and 200 nm; preferably between 1 and 150 nm; preferably between 5 and 100 nm; more preferably between 10 and 50 nm.

In an embodiment, the infiltration layer of the organic-inorganic hybrid material of the present invention has a thickness of more than 1 nm; preferably of more than 2 nm; more preferably of more than 10 nm. In a particular embodiment, the infiltration layer of the organic-inorganic hybrid material of the present invention has a thickness of between 1 and 1000 nm; preferably between 5 and 200 nm; more preferably between 5 and 100 nm; even more preferably between 10 and 100 nm.

In an embodiment, the coating layer has a thickness of between 1 and 200 nm and the infiltration layer has a thickness of between 1 and 1000 nm. In another embodiment, the coating layer has a thickness of between 5 and 100 nm and the infiltration layer has a thickness of between 5 and 200 nm. In a further embodiment, the coating layer has a thickness of between 10 and 50 nm and the infiltration layer has a thickness of between 5 and 100 nm.

Thickness of the infiltration or coating layers can be determined by electron microscopy, specifically transmission electron microscopy, preferably after examination of cross-sectioned samples obtained by cutting the substrate with a focused ion beam and thinning the slice by sputtering with Ar to a thickness suitable for transmission electron microscopy investigation In another embodiment of the invention, the thickness of the infiltration layer represents between 0.05% and 15% of the total thickness of the polymeric substrate. Preferably, between, 0.05% and 10%; more preferably 0.05% and 5%; even more preferably, between 0.1% and 1%.

In a particular embodiment, the organic-inorganic hybrid material of the present invention has at least a 10% increase in the toughness modulus over the toughness modulus of the polymeric substrate. In a particular embodiment, the organic-inorganic hybrid material of the present invention has an equivalent or an increased rupture strain value of the polymeric substrate; preferably the organic-inorganic hybrid material of the present invention has a rupture strain at least 10% larger than the polymeric substrate. In a particular embodiment, the irradiated organic-inorganic hybrid material of the present invention has a toughness modulus of at least a 90% of the polymeric substrate toughness modulus; preferably a 100%; more preferably a 110%. In the context of the present invention the term "irradiated" refers to exposed to UV light with a wavelength of 365 nm for 24 hours. In a particular embodiment, the toughness modulus of the irradiated organic-inorganic hybrid material of the present invention has values of at least 30 MJ/m$^3$ at room temperature (20-25° C.).

In an embodiment the organic-inorganic hybrid material of the present invention is fibers; preferably a fibers with diameters of between 5 and 20 microns and lengths of between 1 and 5 cm; more preferably fibers with diameters of about 10 microns and lengths of about 3 cm.

In the present invention the mechanical properties of the samples are measured according to the ASTM standard C1557-03 test (2008) [ASTM C1557-03(2008), Standard Test Method for Tensile Strength and Young's Modulus of Fibers, ASTM International, West Conshohocken, Pa., 2008].

The inventors have found that the organic-inorganic hybrid materials of the present invention surprisingly maintain or even outperform the individual properties of their substituents; in particular they maintain or improve the mechanical properties of the polymer substrate. In particular, the inventors have observed that the organic-inorganic hybrid material comprising a poly paraphenylene terephthalamide substrate, a coating layer of $Al_2O_3$ on the surface of the poly paraphenylene terephthalamide substrate, and an infiltration layer of ZnO within the paraphenylene terephthalamide substrate outperform the individual properties of the substrate, in particular its resistance to UV light while maintaining or improving its mechanical properties.

In a further aspect, the present invention is directed to the use of the organic-inorganic hybrid materials of the present invention in the fabrication of flexible and light polymeric transistors, capacitors, optoelectronic devices, barriers, absorbers, personal safety equipment such as ballistic vest and military equipment, sport equipment, protective laminate, building materials textiles, automotive and aircraft.

EXAMPLES

The invention is illustrated by means of the following examples which in no case limit the scope of the invention.

Example 1: Preparation of Kevlar Fibers Coated with $Al_2O_3$, Infiltrated with $Al_2O_3$ and Coated with $Al_2O_3$ and Infiltrated with ZnO and their Tensile Strength and UV Resistance Characterization Different fibers were prepared:
a) Kevlar fibers coated with $Al_2O_3$;
b) Kevlar fibers infiltrated with $Al_2O_3$;
c) Kevlar fibers coated with ZnO;
d) Kevlar fibers infiltrated with ZnO; and
e) Kevlar fibers coated with $Al_2O_3$ and infiltrated with ZnO.

In all the experiments poly (p-paraphenylene terephthalamide) fibers (Kevlar® 29 fibers from DuPont), named Kevlar fibers, were used. The fibers had diameters of about 10 μm and lengths of about 3 cm. In addition, all modifications of the samples were performed in a commercial atomic layer deposition (ALD) reactor (Savannah S100, Cambridge NanoTech Inc). Infiltration and coating of the fibers were carried out at 150° C. under a constant nitrogen gas flow of 20 standard cubic centimeters per minute (sccm).

Trimethylaluminum (TMA, $Al(CH_3)_3$, Strem Chemicals) was used as the aluminum source, diethylzinc (DEZ, $Zn(C_2H_5)_2$) was used as zinc source, and demineralized water was the oxygen source.

The $Al_2O_3$ coated fibers were prepared following a typical ALD process with a cycle consisting of Pulse (TMA, 0.08 s)/Purge ($N_2$, 30 s)/Pulse ($H_2O$, 0.08 s)/Purge ($N_2$, 30 s). The ZnO coated fibers were prepared following a typical ALD process with a cycle consisting of Pulse (DEZ, 0.08 s)/Purge ($N_2$, 30 s)/Pulse ($H_2O$, 0.08 s)/Purge ($N_2$, 30 s). In contrast, the infiltrated fibers were prepared by MPI. Here, the substrate was exposed to the precursors for defined periods of time before purging, thereby allowing diffusion of the precursors into the polymer. An MPI cycle for $Al_2O_3$ infiltrated fibers consisted of Pulse (TMA, 0.08 s)/Exposure (30 s)/Purge ($N_2$, 30 s)/Pulse ($H_2O$, 0.08 s)/Exposure (30 s)/Purge ($N_2$, 30 s). An MPI cycle for ZnO infiltrated fibers consisted of: Pulse (DEZ, 0.08 s)/Exposure (30 s)/Purge ($N_2$, 30 s)/Pulse ($H_2O$, 0.08 s)/Exposure (30 s)/Purge ($N_2$, 30 s). Finally, for the preparation of the sample coated with alumina and infiltrated with ZnO a combination of ALD and MPI was used. Each cycle consisted of Pulse (TMA, 0.08 s)/Purge ($N_2$, 30 s)/Pulse (DEZ, 0.08 s)/Exposure (30 s)/Purge ($N_2$, 30 s)/Pulse ($H_2O$, 0.08 s)/Exposure (30 s)/Purge ($N_2$, 30 s). In all cases, the number of repetitive ALD, MPI or ALD/MPI cycles was 200.

Fiber Characterization, Tensile Strength and UV Resistance Test

TEM/EDS Characterization

Transmission Electron Microscopy (TEM) characterization and Energy-dispersive X-ray spectroscopy (EDS) analysis were carried out with a FEI Titan microscope using 300 kV in STEM mode and using an EDAX SDD detector.

FIB lamellae were prepared by gently stretching the Kevlar fibers across a convex aluminium SEM stub (prepared in-house) and fixing both ends of the fibers with carbon tape. Once the location for the block extraction was chosen, the fiber was locally fixed to the substrate with deposited Pt and a block was extracted by standard methods. A Pt electron beam deposition was initially used to protect the sample surface before any ion beam deposition was carried out. The block was thinned to transparency on a copper "Omniprobe" grid using a 5 kV gallium ion beam at 8 pA for final surface preparation.

FIG. 1 shows TEM images of FIB-prepared cross-sections of (a) alumina-coated Kevlar (C—$Al_2O_3$), (b) alumina-infiltrated Kevlar (1-$Al_2O_3$), and (c) Kevlar coated with alumina and infiltrated with ZnO (TMA pulse). In addition, FIG. 1 (d) shows an EDS map of the TMA/MPI pulse sample. The images clearly show the difference between the ALD-coating mode (FIG. 1a) and the MPI-infiltration (FIG. 1b) in addition to the mixed ALD/MPI mode with two different materials (FIG. 1c). In particular, while alumina-coated Kevlar fibers (C—$Al_2O_3$) had a sharp interface between the $Al_2O_3$ thin film and the polymeric core (FIG. 1a), in alumina-infiltrated Kevlar fibers TMA diffused into the polymer and formed a second, less dense $Al_2O_3$ layer in the subsurface area of the polymer (FIG. 1b).

The TEM images of Kevlar fibers coated with alumina and infiltrated with ZnO show a thin film of $Al_2O_3$ of about 20 nm on the surface of the fiber and an infiltrated ZnO layer of about 10 nm in the subsurface area of the polymer (FIGS. 1c and d).

Thus, by a combined ALD/MPI technique, Kevlar fibers coated with an homogeneous and sharp layer of $Al_2O_3$ and infiltrated with a different material (ZnO) can be synthetized.

Mechanical Properties and UV Irradiation

The tensile tests were done with a BRUKER Universal Mechanical Tester with a resolution of 50 μN and in accordance to the ASTM standard C1557-03 (2008))[ASTM C1557-03(2008), Standard Test Method for Tensile Strength and Young's Modulus of Fibers, ASTM International, West Conshohocken, Pa., 2008]. The fibers were fixed to a cardboard sampler holder, which had a punched hole of 6 mm in diameter in the center. After vertical alignment of the fiber across the hole and fixation, the sample holder was positioned in the mechanical tester with the fiber being unstrained. Finally, the sample holder was cut along the central guides and tensile force was applied until rupture of the fiber, while the strain was measured simultaneously at room temperature.

To determine the stability of the fibers under UV light, the samples were exposed to light with a wavelength of 365 nm for 24 hours. Subsequently, the strain-stress curves were measured and compared with the mechanical properties of unexposed fibers.

FIG. 2 shows the comparison of the mechanical properties of untreated Kevlar fibers and fibers after infiltration (1-$Al_2O_3$) or coating (C—$Al_2O_3$) with $Al_2O_3$, after infiltration (I—ZnO) or coating (C—ZnO) with ZnO, and after infiltration with ZnO and simultaneous coating with $Al_2O_3$ (TMA pulse). 1-$Al_2O_3$, C—$Al_2O_3$ with $Al_2O_3$ and TMA pulse samples showed an increase in the toughness modulus as compared to native Kevlar (FIG. 2a). However, despite showing a 13% increase in the toughness modulus, the $Al_2O_3$ coated sample presented failure strain values significantly reduced in comparison to native Kevlar. On the contrary, I—$Al_2O_3$ had similar failure strain values than Kevlar, but only a 5% increase in the modulus of toughness. C—ZnO and I—ZnO showed a decrease in the toughness modulus as compared to native Kevlar (FIG. 2a). Nevertheless, the sample infiltrated with ZnO and coated with $Al_2O_3$ (TMA pulse sample) showed the biggest increase of modulus of toughness (a 17% over the untreated Kevlar fibers), rupture strain value similar to Kevlar and Young's Modulus or UTS values similar to the $Al_2O_3$ coated sample (C—$Al_2O_3$).

Thus, the Kevlar fibers infiltrated with ZnO and coated with $Al_2O_3$ (TMA pulse sample) showed the best mechanical properties over the rest of samples.

The mechanical properties of the coated and infiltrated samples were further analyzed after exposing the fibers to UV light for 24 hours. FIG. 2a shows the toughness modulus results before and after irradiation with UV light, and FIG. 2b shows the stress-strain curves before and after irradiation with UV light.

Untreated Kevlar maintained only 45% of its modulus of toughness after exposure to UV light (FIG. 2a). I—$Al_2O_3$ and C—$Al_2O_3$ samples showed higher UV resistance, maintaining 65% and 70% respectively of their modulus of toughness. I—ZnO and C—ZnO samples showed a reduction of a 70% and of less than 5% of their modulus of toughness. The sample infiltrated with ZnO and coated with $Al_2O_3$ (TMA pulse sample), however, showed significant improvement in resistance against UV light. In fact, a complete suppression of the UV sensitivity was observed with 100% of the toughness modulus being maintained even after exposure to UV light.

SEM

The morphology of the fibers after the tensile tests was also analyzed by SEM. The SEM micrographs were taken in an environmental scanning electron microscope Quanta 250 FEG with a large field detector (LFD). The ruptured fibers were stuck to a carbon tape and the images were taken at 10 kV and 70 Pa.

FIG. 3 shows SEM images of the broken ends of native, coated and infiltrated Kevlar samples after irradiation with UV light in comparison to Kevlar before irradiation. The broken terminals of the fibers indicate the fracture mode being fibrillar or brittle depending on the pretreatment being coating or infiltration. FIG. 3 shows that the failure of Kevlar fibers was mainly caused by fibrillation and splitting along the fiber axis. On the contrary, the fracture area of the UV-irradiated sample, in contrast, showed negligible fibrillation. This fracture mode is characteristic of brittle materials and is caused by UV induced polymer chain scission reactions resulting in weakening of the tensile modulus and strength of the fiber. The same fracture mode is observed in C—$Al_2O_3$ and 1-$Al_2O_3$Kevlar samples after UV exposure, indicating that the $Al_2O_3$ coating does not prevent UV-induced chain-scission reactions. On the contrary, Kevlar fibers infiltrated with ZnO and coated with $Al_2O_3$(TMA pulse UV sample) showed, after exposure to UV light, the fibrillar type of fracture characteristic from native Kevlar. The longitudinal splitting and the fibrillation showed that the combination of alumina coating and ZnO infiltration does not significantly embrittle the fiber.

Attenuated Total Reflectance-Fourier Transformed Infrared Spectroscopy (ATR-FTIR)

The Attenuated Total Reflectance-Fourier Transformed Infrared spectroscopy (ATR-FTIR) spectra of the samples were acquired with a Perkin Elmer Frontier spectrometer with an ATR sampling stage. All spectra were measured collecting 20 scans in the range from 520 to 4000 $cm^{-1}$ with 1 $cm^{-1}$ resolution. Each sample was measured 5 times and the results were averaged.

FIG. 4 shows the fingerprint area (1200-800 $cm^{-1}$) of the ATR-FTIR spectra of Kevlar fibers before and after coating and infiltration, wherein the stretching signatures of C—N, C—O and C—C bonds in the fingerprint area (1000-800 $cm^{-1}$) of the ATR-FTIR spectra of the samples can be seen as follows:

a peak at 940 $cm^{-1}$ related to the presence of C—O single bonds due to the binding of the Lewis acid TMA to the oxygen of the C=O bond in the amide of the Kevlar fiber surface;

a peak around 960 $cm^{-1}$ assigned to C—C stretching resulting from newly developed C—C bonds; and a pronounced peak at 980 $cm^{-1}$ related to the C—N bond.

The intensities of the 940 and 960 $cm^{-1}$ peaks are lower in the TMA pulse sample, showing a moderate level of chemical modification, than in the $Al_2O_3$-coated and $Al_2O_3$-infiltrated samples. Additionally, the peak at 980 $cm^{-1}$ related to the C—N bond of the native Kevlar can be seen in the ATR-FTIR spectra of the sample infiltrated with ZnO and coated with $Al_2O_3$, while this peak nearly vanished in the C—$Al_2O_3$ and 1-$Al_2O_3$ samples. Therefore, the alumina treated samples have more strongly degraded polymer chains.

Thus, Kevlar fibers infiltrated with ZnO and coated with $Al_2O_3$ showed improved mechanical properties (strength and flexibility) over the original Kevlar fibers and no degradation of their properties after UV light exposure.

Example 2: Preparation of Kevlar Fibers Coated with $TiO_2$ and Infiltrated with $In_2O_3$ Kevlar fibers were coated and infiltrated following the process described in example 1 but using an ALD/MPI cycle consisting of 0.08 seconds pulse of titanium tetra-isopropoxide (TTIP) followed by 30 seconds of purging (an ALD like pulse), 0.08 seconds pulse of trimethyl indium followed by 30 seconds of exposure and 30 seconds of purge (an MPI like pulse) and 0.08 seconds of water followed by 30 seconds of exposure and 30 seconds of purge (an MPI like pulse). The coating and infiltration process consisted in 200 cycles of ALD/MPI.

Example 3: Preparation of Kevlar Fibers Coated with $Al_2O_3$, and Infiltrated with $In_2O_3$ Kevlar fibers were coated and infiltrated following the process described in example 1 but using an ALD/MPI cycle consisting of 0.08 seconds pulse of trimethyl aluminium followed by 30 seconds of purging (an ALD like pulse), 0.08 seconds pulse of trimethyl indium followed by 30 seconds of exposure and 30 seconds of purge (an MPI like pulse) and 0.08 seconds of water followed by 30 seconds of exposure and 30 seconds of purge (an MPI like pulse). The coating and infiltration process consisted in 200 cycles of ALD/MPI.

The present invention is further defined in the embodiments that follow:

1. A process for the preparation of organic-inorganic hybrid materials comprising the steps of:
   i) providing a polymeric substrate in a reaction chamber;
   ii) pulsing a first metal precursor or a monofunctional organic molecule into the reaction chamber and then purging the reaction chamber with no exposure time between the pulsing and the purging;
   iii) pulsing a second metal precursor into the reaction chamber, followed by an exposure time and then purging of the reaction chamber, wherein the exposure time between the pulsing and the purging is at least 5 seconds; and
   iv) pulsing a co-reactant into the reaction chamber followed by an exposure time and then purging of the reaction chamber, wherein the exposure time between the pulsing and the purging is at least 5 seconds and wherein the co-reactant reacts with the first metal precursor when no monofunctional organic molecule is pulsed in step (ii) and with the second metal precursor.

2. Process according to embodiment 1, which comprises:
   i) providing a polymeric substrate in a reaction chamber,
   ii) pulsing a first metal precursor into the reaction chamber and then purging the reaction chamber with no exposure time between the pulsing and the purging, to obtain a polymeric substrate coated with the first metal precursor,
   iii) pulsing a second metal precursor into the reaction chamber, followed by an exposure time and then purging of the reaction chamber, wherein the exposure time between the pulsing and the purging is at least 5 seconds, to obtain a polymeric substrate coated with the first metal precursor and infiltrated with the second metal precursor, and
   iv) pulsing a co-reactant into the reaction chamber followed by an exposure time and then purging of the reaction chamber, wherein the exposure time between the pulsing and the purging is at least 5 seconds and wherein the co-reactant reacts with the first and with the second metal precursor, to obtain a polymeric substrate coated with a first metal compound and infiltrated with a second metal compound.

3. Process according to any one of embodiments 1 or 2, which comprises:
   i) providing a polymeric substrate in a reaction chamber,
   ii) pulsing a first metal precursor into the reaction chamber and then purging the reaction chamber with no exposure time between the pulsing and the purging, to obtain a polymeric substrate coated with the first metal precursor,
   ii') pulsing a monofunctional organic molecule into the reaction chamber and then purging the reaction chamber with no exposure time between the pulsing and the purging, wherein the monofunctional organic molecule reacts with the first metal precursor, to obtain a polymeric substrate coated with a first metal compound and the monofunctional organic molecule,
   iii) pulsing a second metal precursor into the reaction chamber, followed by an exposure time and then purging of the reaction chamber, wherein the exposure time between the pulsing and the purging is at least 5 seconds, to obtain a polymeric substrate coated with a first metal precursor and the monofunctional organic molecule and infiltrated with the second metal precursor, and
   iv) pulsing a co-reactant into the reaction chamber followed by an exposure time and then purging of the reaction chamber, wherein the exposure time between the pulsing and the purging is at least 5 seconds and wherein the co-reactant reacts with the second metal precursor, to obtain a polymeric substrate coated with a first metal compound and the monofunctional organic molecule and infiltrated with the second metal compound.

4. Process according to embodiment 1, which comprises:
   i) providing a polymeric substrate in a reaction chamber,
   ii) pulsing a monofunctional organic molecule into the reaction chamber and then purging the reaction chamber with no exposure time between the pulsing and the purging, to obtain a polymeric substrate coated with the monofunctional organic molecule,
   iii) pulsing a metal precursor into the reaction chamber, followed by an exposure time and then purging of the reaction chamber, wherein the exposure time between the pulsing and the purging is at least 5 seconds, to obtain a polymeric substrate coated with the monofunctional organic molecule and infiltrated with the second metal precursor, and
   iv) pulsing a co-reactant into the reaction chamber followed by an exposure time and then purging of the reaction chamber, wherein the exposure time between the pulsing and the purging is at least 5 seconds and wherein the co-reactant reacts with the second metal precursor, to obtain a polymeric substrate coated with the monofunctional organic molecule and infiltrated with the metal compound.

5. Process according to any one of embodiments 1 to 4, wherein the first metal precursor is different from the second metal precursor.

6. An organic-inorganic hybrid material obtainable by a process according to any one of embodiments 1 to 5.

7. An organic-inorganic hybrid material comprising:
   a polymeric substrate,
   a coating layer on the surface of the polymeric substrate, wherein said coating layer comprises a first metal compound or a monofunctional organic molecule or a mixture thereof, and
   an infiltration layer within the polymeric substrate, wherein said infiltration layer comprises a second metal compound, wherein the first and the second metal compounds are different and wherein said coating layer does not comprise said second metal compound.

8. The organic-inorganic hybrid material according to embodiment 7, which comprises:
    a polymeric substrate,
    a coating layer on the surface of the polymeric substrate, wherein said coating layer comprises a first metal compound, and
    an infiltration layer within the polymeric substrate, wherein said infiltration layer comprises a second metal compound;
or
    a polymeric substrate,
    a coating layer on the surface of the polymeric substrate, wherein said coating layer comprises a monofunctional organic molecule, and
    an infiltration layer within the polymeric substrate, wherein said infiltration layer comprises a metal compound;
or
    a polymeric substrate,
    a coating layer on the surface of the polymeric substrate, wherein said coating layer comprises a first layer in contact with the surface of the polymeric substrate comprising a first metal compound, and a second layer in contact with the first layer and comprising a monofunctional organic molecule, and
    an infiltration layer within the polymeric substrate, wherein said infiltration layer comprises a second metal compound.

9. Process according to any one of embodiments 1 to 5 or organic-inorganic hybrid material according to any one of embodiments 6 to 8, wherein the polymeric substrate is selected from polyamides, polyamines, polyimides, polyalkylenes, polyacrylates, polyalcohols, polyethers, polyesters, polyvinyls, polypyrroles, polythiophenes, polystyrenes and polyketones.

10. Process according to any one of embodiments 1 to 5 and 9 or organic-inorganic hybrid material according to any one of embodiments 6 to 9, wherein the polymeric substrate is selected from aromatic polyamide, such as para-aramid and meta-aramid polymers.

11. Process according to any one of embodiments 1 to 5 and 9 to 10 or organic-inorganic hybrid material according to any one of embodiments 6 to 10, wherein the first and second metal compounds comprise independently a metal selected from Al, Zn, Si, Ti, W, Sb, As, Ba, Bi, B, Cd, Ca, Ce, Cr, Co, Cu, Er, Eu, Gd, Ga, Ge, Hf, Fe, La, Mg, Mn, Mo, Ni, Nb, Os, Pt, Pr, Re, Rh, Ru, Sm, Se, Si, Sr, Ta, Te, Tb, Tm, Sn, Ti, W, V, Yb, Y, Zr, Pd, In, Ir and Li.

12. Process according to any one of embodiments 1 to 5 and 9 to 11 or organic-inorganic hybrid material according to any one of embodiments 6 to 11, wherein the first and second metal compounds are independently selected from a metal oxide, a metal nitride and a zero valent metal.

13. Process according to any one of embodiments 1 to 5 and 9 to 12 or organic-inorganic hybrid material according to any one of embodiments 6 to 12, wherein the first and second metal compounds are independently selected from $Al_2O_3$, $ZnO$, $SiO_2$, $In_2O_3$ and $TiO_2$.

14. Process according to any one of embodiments 1 to 5 and 9 to 13 or organic-inorganic hybrid material according to any one of embodiments 6 to 13, wherein the monofuctional organic molecule is an aliphatic or aromatic monofunctional organic molecule with one functional group selected from hydroxyl, amino, carboxylic acid, ester, amido, silane, thiol, epoxy, nitro and acid halide.

15. Use of an organic-inorganic hybrid material as defined in any of embodiments 6-13 in the fabrication of flexible and light polymeric transistors, capacitors, optoelectronic devices, barriers, absorbers, personal safety equipment, sport equipment, protective laminate, building materials, textiles, automotive and aircraft materials.

The invention claimed is:

1. A process for the preparation of organic-inorganic hybrid materials comprising the steps of:
    i) providing a polymeric substrate in a reaction chamber;
    ii) pulsing a first metal, semimetal or semiconductor precursor or monofunctional or oligofunctional organic molecule into the reaction chamber directly on a surface of the polymeric substrate and then purging the reaction chamber, wherein there is no exposure time between the pulsing and the purging;
    iii) pulsing a second metal, semimetal or semiconductor precursor into the reaction chamber, followed by an exposure time and then purging of the reaction chamber, wherein the exposure time between the pulsing and the purging is at least 5 seconds; and
    iv) pulsing a co-reactant into the reaction chamber optionally followed by an exposure time and then purging of the reaction chamber, wherein the co-reactant reacts with the first metal, semimetal or semiconductor precursor when no monofunctional or oligofunctional organic molecule is pulsed in step (ii) and/or with the second metal, semimetal or semiconductor precursor;
    v) if necessary, pulsing a co-reactant into the reaction chamber, optionally followed by an exposure time, and then purging of the reaction chamber, wherein the co-reactant reacts with the unreacted first or second metal, semimetal or semiconductor precursor;
    wherein the co-reactant of step (iv) is different from the co-reactant of step (v) and wherein the first metal, semimetal or semiconductor precursor is different from the second metal, semimetal or semiconductor precursor.

2. The process according to claim 1,
    wherein in step iv) there is an exposure time between the pulsing of the co-reactant and the purging of the reaction chamber of at least 5 seconds and wherein the co-reactant reacts with the first metal, semimetal or semiconductor precursor when no monofunctional or oligofunctional organic molecule is pulsed in step ii) and with the second metal, semimetal or semiconductor precursor.

3. The process according to claim 1, wherein
    in step ii) the first metal, semimetal or semiconductor precursor is pulsed into the reaction chamber directly on the surface of the polymeric substrate and then purging the reaction chamber wherein there is no exposure time between the pulsing and the purging, to obtain a polymeric substrate coated with the first metal, semimetal or semiconductor precursor,
    in step iii) a polymeric substrate coated with the first metal, semimetal or semiconductor precursor and infiltrated with the second metal, semimetal or semiconductor precursor is obtained, and
    in step iv) there is an exposure time between the pulsing of the co-reactant and the purging of the reaction chamber of at least 5 seconds, and wherein the co-reactant reacts with the first and with the second metal, semimetal or semiconductor precursor, to obtain a polymeric substrate coated with a first metal, semimetal or semiconductor compound or element and infiltrated with a second metal, semimetal or semiconductor compound or element.

4. The process according to claim 3, wherein the first and second metal, semimetal or semiconductor compound or element are independently selected from a metal oxide, a metal nitride, metal sulfide and a zero valent metal.

5. The process according to claim 3, wherein the first and second metal, semimetal or semiconductor compound or element are independently selected from $Al_2O_3$, ZnO, $SiO_2$, $In_2O_3$ and $TiO_2$.

6. The process according to claim 1, wherein
in step ii) the first metal, semimetal or semiconductor precursor is pulsed into the reaction chamber directly on the surface of the polymeric substrate, to obtain a polymeric substrate coated with the first metal, semimetal or semiconductor precursor,
in a step ii') the monofunctional or oligofunctional organic molecule is pulsed into the reaction chamber and then the reaction chamber is purged wherein there is no exposure time between pulsing and purging, wherein the monofunctional or oligofunctional organic molecule reacts with the first metal, semimetal or semiconductor precursor, to obtain a polymeric substrate coated with a first metal, semimetal or semiconductor compound or element and the monofunctional or oligofunctional organic molecule,
in step iii) a polymeric substrate coated with the first metal, semimetal or semiconductor precursor and the monofunctional or oligofunctional organic molecule and infiltrated with the second metal, semimetal or semiconductor precursor is obtained, and
in step iv) there is an exposure time between the pulsing of the co-reactant and the purging of the reaction chamber of at least 5 seconds and wherein the co-reactant reacts with the second metal, semimetal or semiconductor precursor, to obtain a polymeric substrate coated with a first metal, semimetal or semiconductor compound or element and the monofunctional or oligofunctional organic molecule and infiltrated with the second metal, semimetal or semiconductor compound or element.

7. The process according to claim 1, wherein
in step ii) the monofunctional or oligofunctional organic molecule is pulsed into the reaction chamber directly on the surface of the polymeric substrate, to obtain a polymeric substrate coated with the monofunctional or oligofunctional organic molecule,
in step iii) a polymeric substrate coated with the monofunctional or oligofunctional organic molecule and infiltrated with the second metal, semimetal or semiconductor precursor is obtained, and
in step iv) there is an exposure time between the pulsing of the co-reactant and the purging of the reaction chamber of at least 5 seconds and wherein the co-reactant reacts with the second metal, semimetal or semiconductor precursor, to obtain a polymeric substrate coated with the monofunctional or oligofunctional organic molecule and infiltrated with the metal, semimetal or semiconductor compound or element.

8. The process according to claim 1, wherein the polymeric substrate is selected from polyamides, polyamines, polyimides, polyalkylenes, polyacrylates, polyalcohols, polyethers, polyesters, polyvinyls, polypyrroles, polythiophenes, polystyrenes and polyketones.

9. The process according to claim 1, wherein the first and second metal, semimetal or semiconductor precursor comprise independently Al, Zn, Si, Ti, W, Sb, As, Ba, Bi, B, Cd, Ca, Ce, Cr, Co, Cu, Er, Eu, Gd, Ga, Ge, Hf, Fe, La, Mg, Mn, Mo, Ni, Nb, Os, Pt, Pr, Re, Rh, Ru, Sm, Se, Sr, Ta, Te, Tb, Tm, Sn, V, Yb, Y, Zr, Pd, In, Ir or Li.

10. The process according to claim 1, wherein the monofunctional or oligofunctional organic molecule is an aliphatic or aromatic monofunctional or oligofunctional organic molecule with at least one functional group selected from hydroxyl, amino, carboxylic acid, ester, amido, silane, thiol, epoxy, nitro and acid halide.

11. An organic-inorganic hybrid material obtainable by the process according to claim 1.

12. The organic-inorganic hybrid material according to claim 11, which comprises:
the polymeric substrate,
a coating layer directly on the surface of the polymeric substrate, wherein said coating layer comprises the first metal, semimetal or semiconductor compound or element, and
a infiltration layer within the polymeric substrate, wherein said infiltration layer comprises the second metal, semimetal or semiconductor compound or element;
or
the polymeric substrate,
a coating layer directly on the surface of the polymeric substrate, wherein said coating layer comprises the monofunctional or oligofunctional organic molecule, and
a infiltration layer within the polymeric substrate, wherein said infiltration layer comprises the metal, semimetal or semiconductor compound or element;
or
the polymeric substrate,
a coating layer directly on the surface of the polymeric substrate, wherein said coating layer comprises the first layer in contact with the surface of the polymeric substrate comprising the first metal, semimetal or semiconductor compound or element, and the second layer in contact with the first layer and comprising the monofunctional or oligofunctional organic molecule, and
a infiltration layer within the polymeric substrate, wherein said infiltration layer comprises the second metal, semimetal or semiconductor compound or element.

13. The organic-inorganic hybrid material according to claim 12, wherein the infiltration layer has a thickness of more than 1 nm.

14. The organic-inorganic hybrid material according to claim 12, wherein the infiltration layer has a thickness of between 1 and 200 nm.

15. The organic-inorganic hybrid material according to claim 11, wherein the polymeric substrate is selected from polyamides, polyamines, polyimides, polyalkylenes, polyacrylates, polyalcohols, polyethers, polyesters, polyvinyls, polypyrroles, polythiophenes, polystyrenes and polyketones.

16. The organic-inorganic hybrid material according to claim 11, wherein the first and second metal, semimetal or semiconductor compound or element comprise independently Al, Zn, Si, Ti, W, Sb, As, Ba, Bi, B, Cd, Ca, Ce, Cr, Co, Cu, Er, Eu, Gd, Ga, Ge, Hf, Fe, La, Mg, Mn, Mo, Ni, Nb, Os, Pt, Pr, Re, Rh, Ru, Sm, Se, Sr, Ta, Te, Tb, Tm, Sn, V, Yb, Y, Zr, Pd, In, Ir or Li.

17. The organic-inorganic hybrid material according to claim 11, wherein the first and second metal, semimetal or semiconductor compound or element are independently selected from a metal oxide, a metal nitride, a metal sulfide and a zero valent metal.

18. The organic-inorganic hybrid material according to claim 11, wherein the first and second metal, semimetal or semiconductor compound or element are independently selected from $Al_2O_3$, ZnO, $SiO_2$, $In_2O_3$ and $TiO_2$.

19. The organic-inorganic hybrid material according to claim 11, wherein the monofunctional or oligofunctional organic molecule is an aliphatic or aromatic monofunctional or oligofunctional organic molecule with at least one functional group selected from hydroxyl, amino, carboxylic acid, ester, amido, silane, thiol, epoxy, nitro and acid halide.

\* \* \* \* \*